United States Patent
Yanagida

(10) Patent No.: US 10,658,304 B2
(45) Date of Patent: May 19, 2020

(54) SEMICONDUCTOR DEVICE AND METHOD FOR MANUFACTURING THE SAME

(71) Applicant: ROHM CO., LTD., Kyoto (JP)

(72) Inventor: Hideaki Yanagida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/202,345

(22) Filed: Nov. 28, 2018

(65) Prior Publication Data

US 2019/0164906 A1 May 30, 2019

(30) Foreign Application Priority Data

Nov. 30, 2017 (JP) .................................. 2017-229957

(51) Int. Cl.
| | |
|---|---|
| *H01L 23/552* | (2006.01) |
| *H01L 23/13* | (2006.01) |
| *H01L 23/31* | (2006.01) |
| *H01L 21/48* | (2006.01) |
| *H01L 21/56* | (2006.01) |
| *H01L 23/00* | (2006.01) |

(52) U.S. Cl.
CPC ........ *H01L 23/552* (2013.01); *H01L 21/4817* (2013.01); *H01L 21/56* (2013.01); *H01L 23/13* (2013.01); *H01L 23/3107* (2013.01); *H01L 23/3128* (2013.01); *H01L 24/16* (2013.01); *H01L 24/05* (2013.01); *H01L 24/13* (2013.01); *H01L 2224/05624* (2013.01); *H01L 2224/13082* (2013.01); *H01L 2224/13111* (2013.01); *H01L 2224/13155* (2013.01); *H01L 2224/16225* (2013.01); *H01L 2224/16227* (2013.01); *H01L 2924/15173* (2013.01); *H01L 2924/15321* (2013.01); *H01L 2924/181* (2013.01)

(58) Field of Classification Search
CPC . H01L 2224/48227; H01L 2224/32225; H01L 2224/73265; H01L 2924/181
USPC ......................................... 257/659, 773, 686
See application file for complete search history.

(56) References Cited

U.S. PATENT DOCUMENTS

| | | | |
|---|---|---|---|
| 9,129,932 B2* | 9/2015 | Hayashi | ................. H01L 25/072 |
| 2009/0289352 A1* | 11/2009 | Horie | ................... H01L 23/3675 257/712 |
| 2016/0242292 A1* | 8/2016 | Nishimura | .............. H05K 1/183 |

FOREIGN PATENT DOCUMENTS

JP         2005-353713 A      12/2005

* cited by examiner

*Primary Examiner* — Jonathan Han
(74) *Attorney, Agent, or Firm* — Rabin & Berdo, P.C.

(57) ABSTRACT

A semiconductor device includes an electroconductive shielding layer, an isolation layer formed with a frame-shaped opening, a wiring layer on the isolation layer to be surrounded by the opening, a semiconductor element on the wiring layer with its back surface facing the wiring layer, electroconductive pillars spaced apart from the semiconductor element and standing on the wiring layer, and an electroconductive frame standing on an exposed region of the shielding layer through the opening, with the frame surrounding the semiconductor element and the electroconductive pillars. The semiconductor device further includes an electrically insulating sealing resin that covers the wiring layer and the semiconductor element, and the frame is configured to be electrically connected to an external ground terminal.

16 Claims, 25 Drawing Sheets

SEMICONDUCTOR DEVICE AND METHOD FOR MANUFACTURING THE SAME

FIELD

The present disclosure relates to a semiconductor device and a method for manufacturing the same.

BACKGROUND

Switching elements used in power semiconductor devices such as power modules are required to switch higher electric currents at high speeds. However, if the switching elements receive electromagnetic radiation from nearby electronic devices, the switching operation may be delayed and power loss may be increased. In addition, the switching elements emit electromagnetic radiation during operation, which may interfere with nearby electronic devices.

JP-A-2005-353713 discloses a semiconductor device having a semiconductor element as a switching element and an electrical conductor for electromagnetic shielding. The electrical conductor is disposed over the semiconductor element to block electromagnetic waves to and from the semiconductor element. In one example, the electromagnetic shielding conductor is composed of a plurality of metal wires. In another example, the electromagnetic shielding conductor is composed of a lead frame having holes. Incorporating such an electrical conductor for electromagnetic shielding, however, is not desirable to reduce the size of the semiconductor device.

SUMMARY

In view of the circumstances described above, the present disclosure aims to provide a semiconductor device capable of blocking incoming electromagnetic radiation from an external source and outgoing electromagnetic ration from the semiconductor element, while achieving a size reduction. The present disclosure also aims to provide a method for manufacturing such a semiconductor device.

According to a first aspect of the present disclosure, there is provided a semiconductor device that includes: an electroconductive shielding layer; an isolation layer formed on the shielding layer and comprising a frame-shaped opening as viewed in a thickness direction; a wiring layer disposed on the isolation layer so as to be surrounded by the opening; a semiconductor element having an element front surface and an element back surface that are opposite to each other in the thickness direction, where the semiconductor element is disposed on the wiring layer with the element back surface facing the wiring layer; electroconductive pillars spaced apart from the semiconductor element and standing on the wiring layer in the thickness direction; an electroconductive frame standing on a region of the shielding layer exposed through the opening in the thickness direction, where the frame surrounds the semiconductor element and the electroconductive pillars as viewed in the thickness direction; and an electrically insulating sealing resin covering the wiring layer and the semiconductor element. The frame of the semiconductor device is configured to be electrically connected to an external ground terminal.

According to a second aspect of the present disclosure, there is provided a method for manufacturing a semiconductor device, and the method may include the following steps. An electroconductive shielding layer is formed on a base member; an isolation layer is formed on the shielding layer; a frame-shaped opening is formed in the isolation layer; a wiring layer is formed on the isolation layer so as to be surrounded by the frame-shaped opening; an electroconductive frame is so formed as to stand from the frame-shaped opening and also electroconductive pillars are formed to stand on the wiring layer; and a semiconductor element is mounted on the wiring layer. By the method, the frame and the electroconductive pillars are formed simultaneously by electroplating such that one of the electroconductive pillars is to be connected to the frame.

Further features and advantages of the present disclosure will become apparent from the following detailed description with reference to the accompanying drawings.

DRAWINGS

EMBODIMENTS

Figure 1:
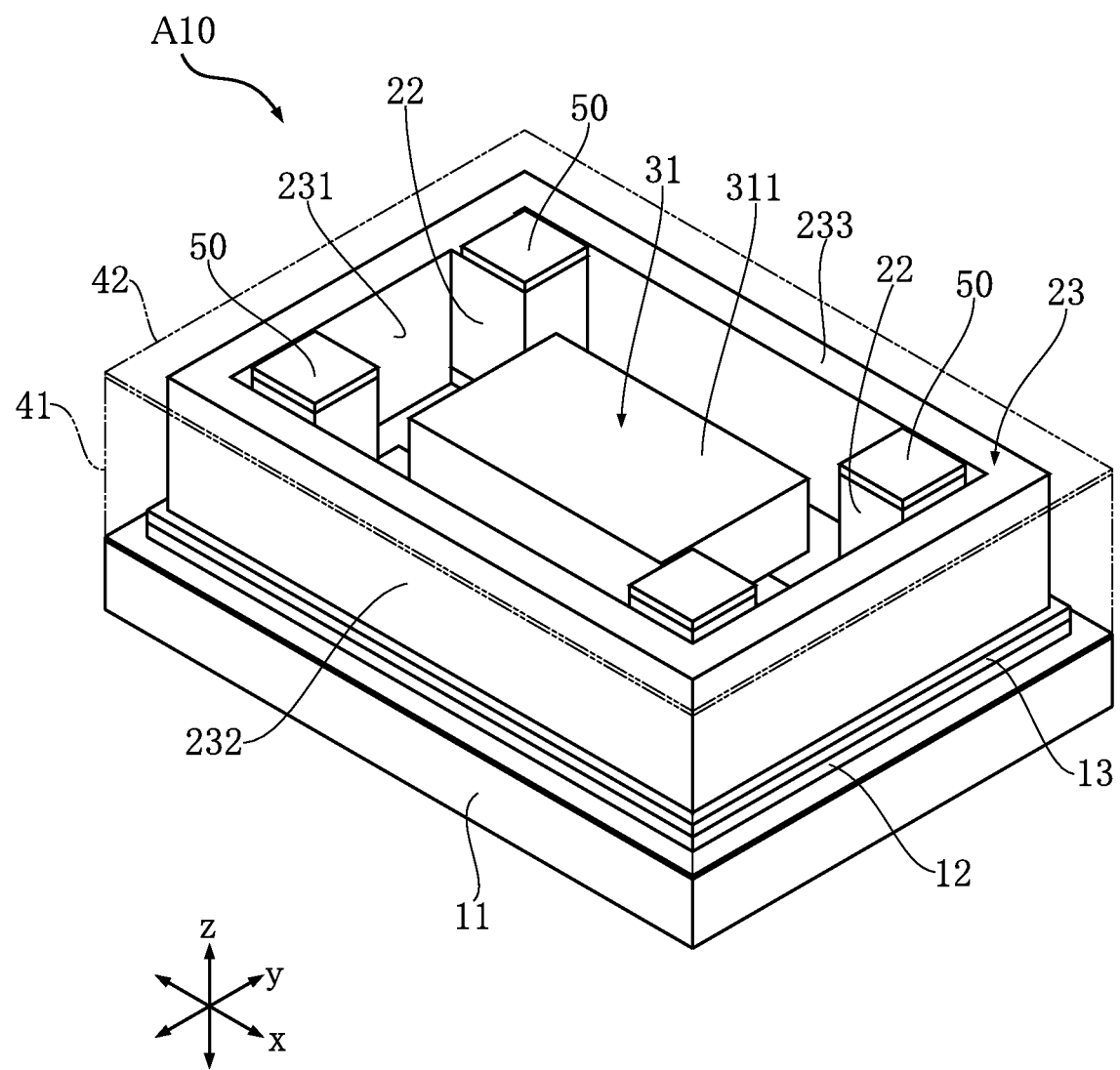
FIG. 1 is a perspective view of a semiconductor device (with a sealing resin and an outer protective layer shown in phantom) according to a first embodiment of the present disclosure.

With reference to the accompanying drawings, modes for carrying out the present disclosure (hereinafter, "embodiments") will be described.

With reference to FIGS. 1 to 11, a semiconductor device A10 according to a first embodiment of the present disclosure will be described. The semiconductor device A10 includes a shielding layer 12, an isolation layer 13, a wiring layer 21, a semiconductor element 31, electroconductive pillars 22, a frame 23 and a sealing resin 41. Additionally, the semiconductor device A10 includes a substrate 11, a bonding layer 32, an inner protective layer 33, an outer protective layer 42 and terminals 50.

Figure 3:
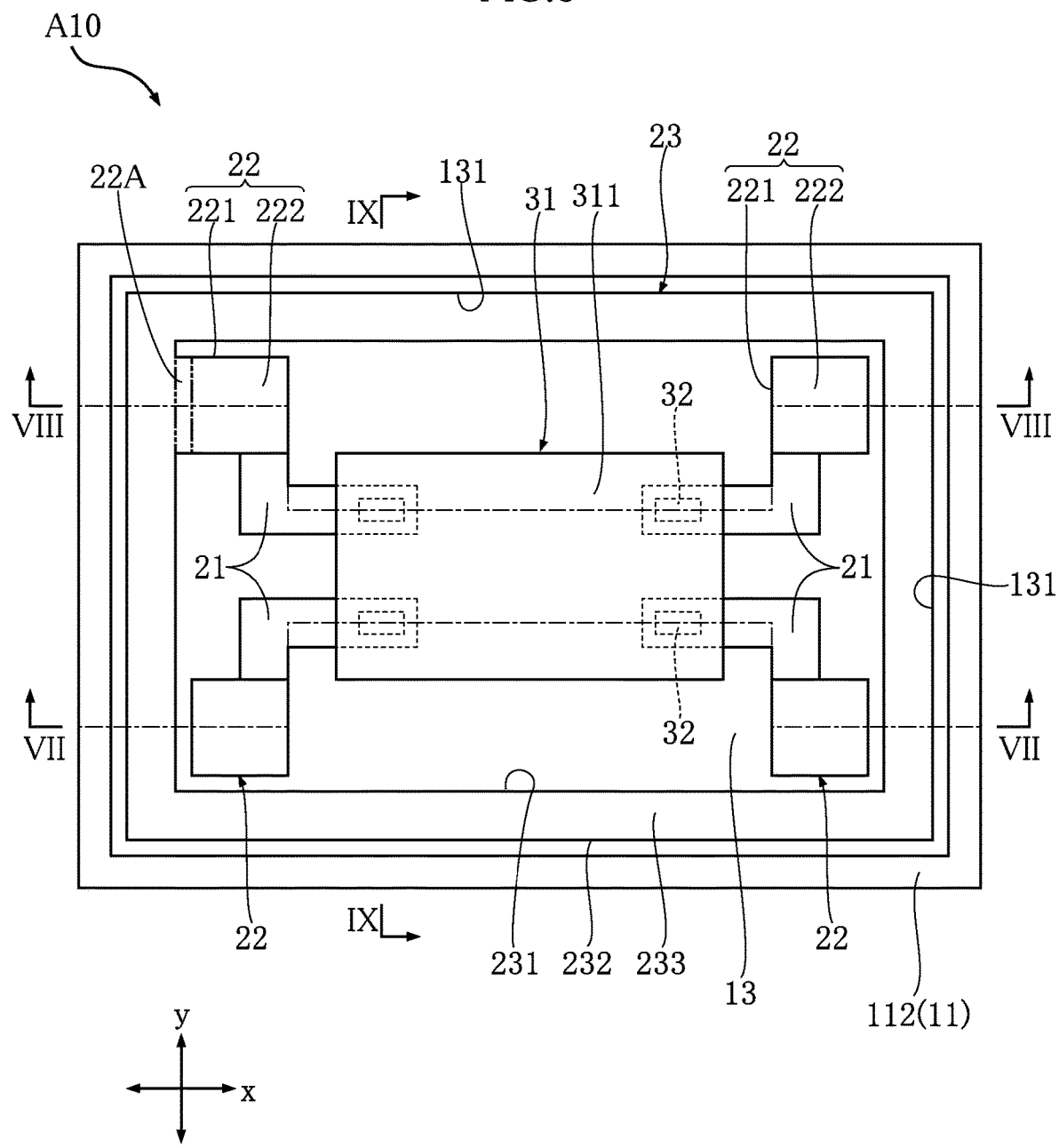
FIG. 3 is a plan view of FIG. 2, with the sealing resin, the outer protective layer and terminals shown in phantom.
Figure 4:
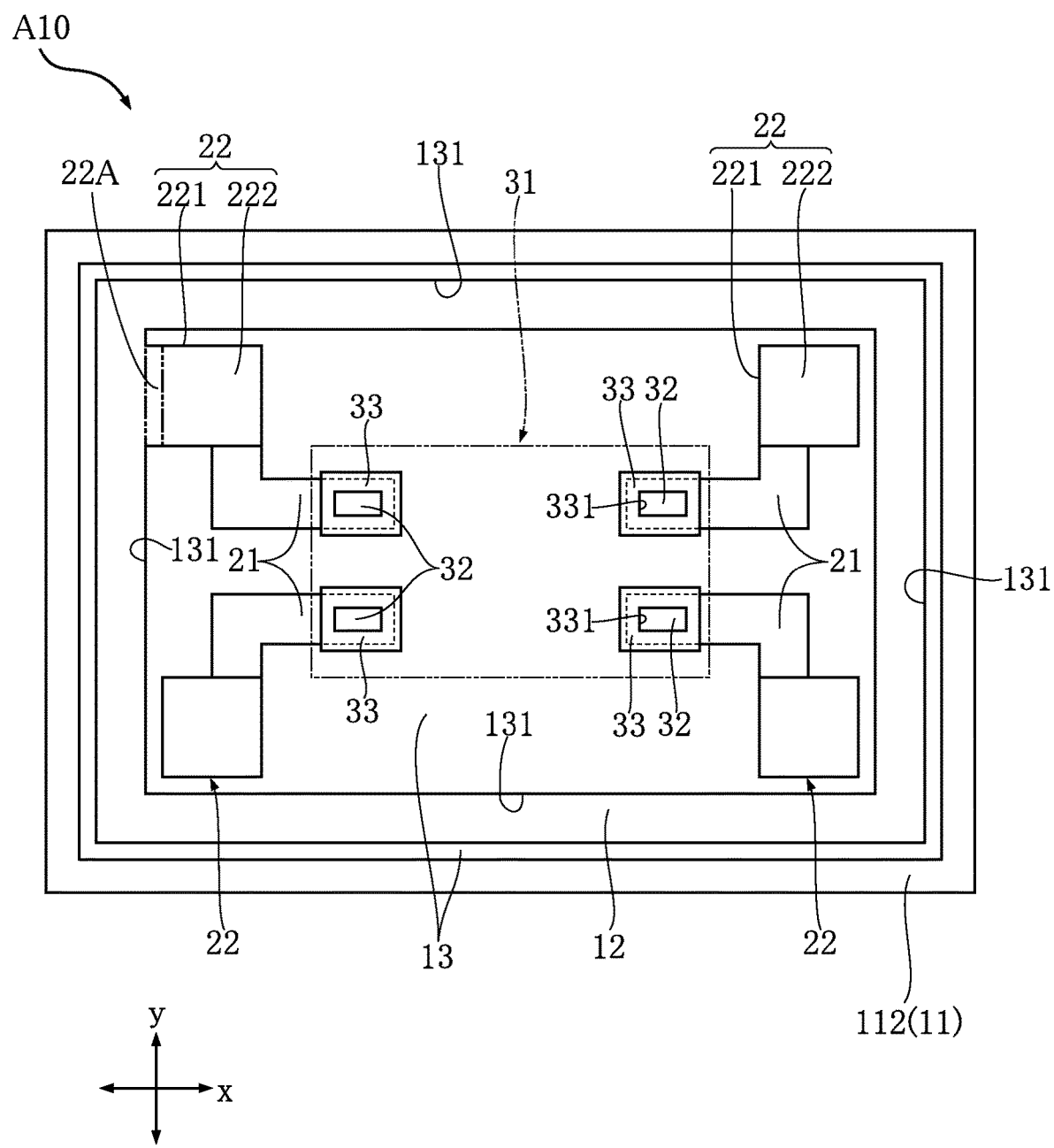
FIG. 4 is a plan view of FIG. 3, with a frame and a semiconductor element shown in phantom.
Figure 7:
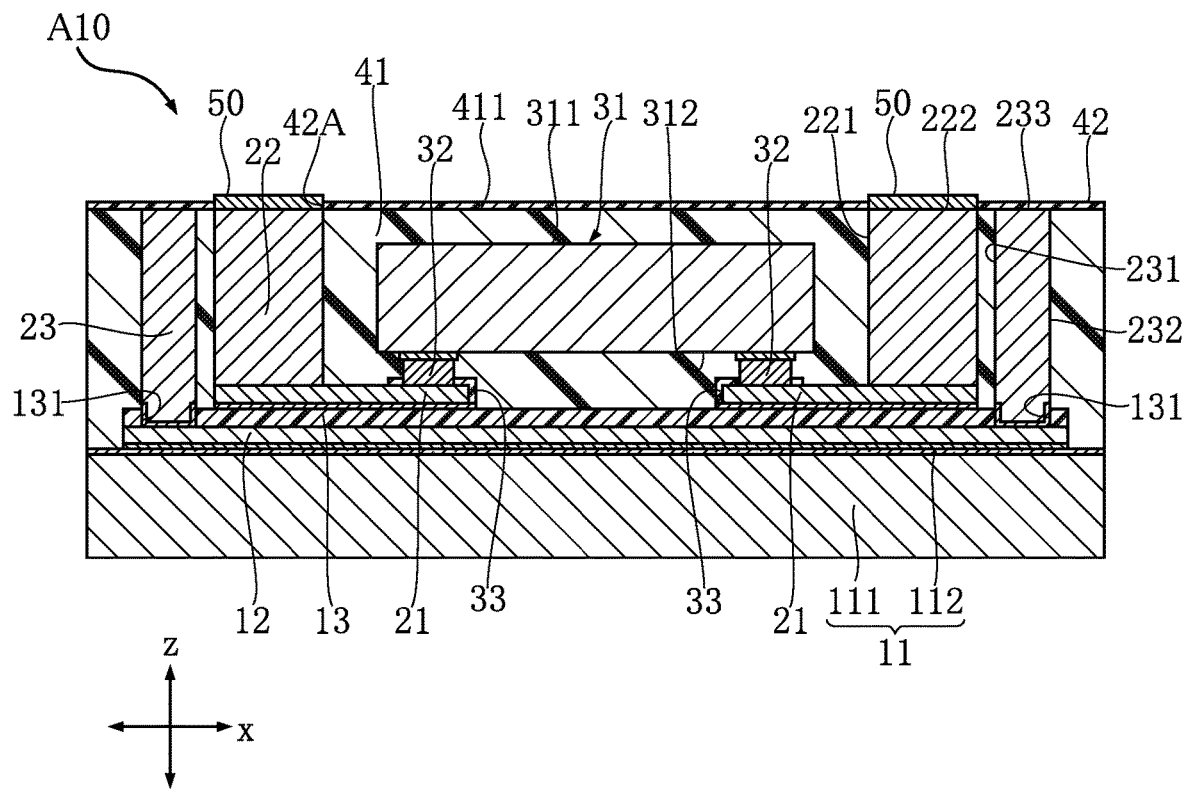
FIG. 7 is a sectional view taken along line VII-VII of FIG. 3.
Figure 8:
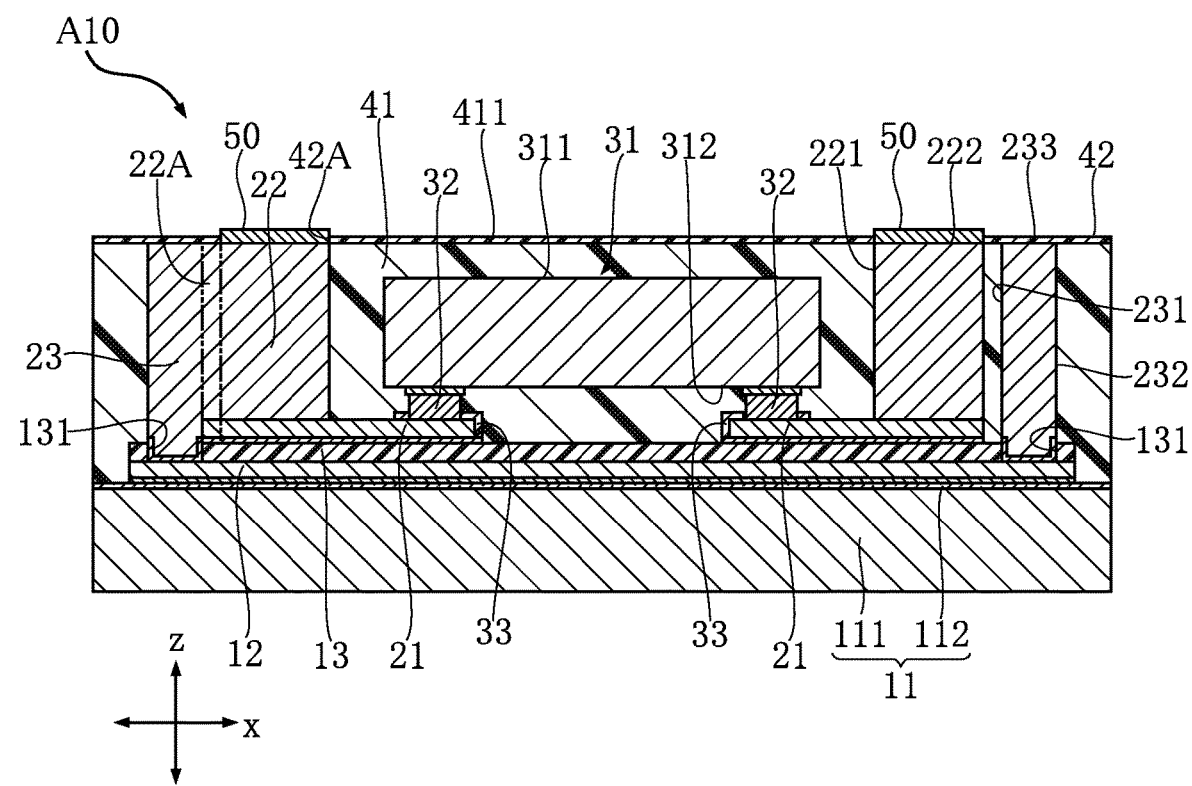
FIG. 8 is a sectional view taken along line VIII-VIII of FIG. 3.
Figure 10:
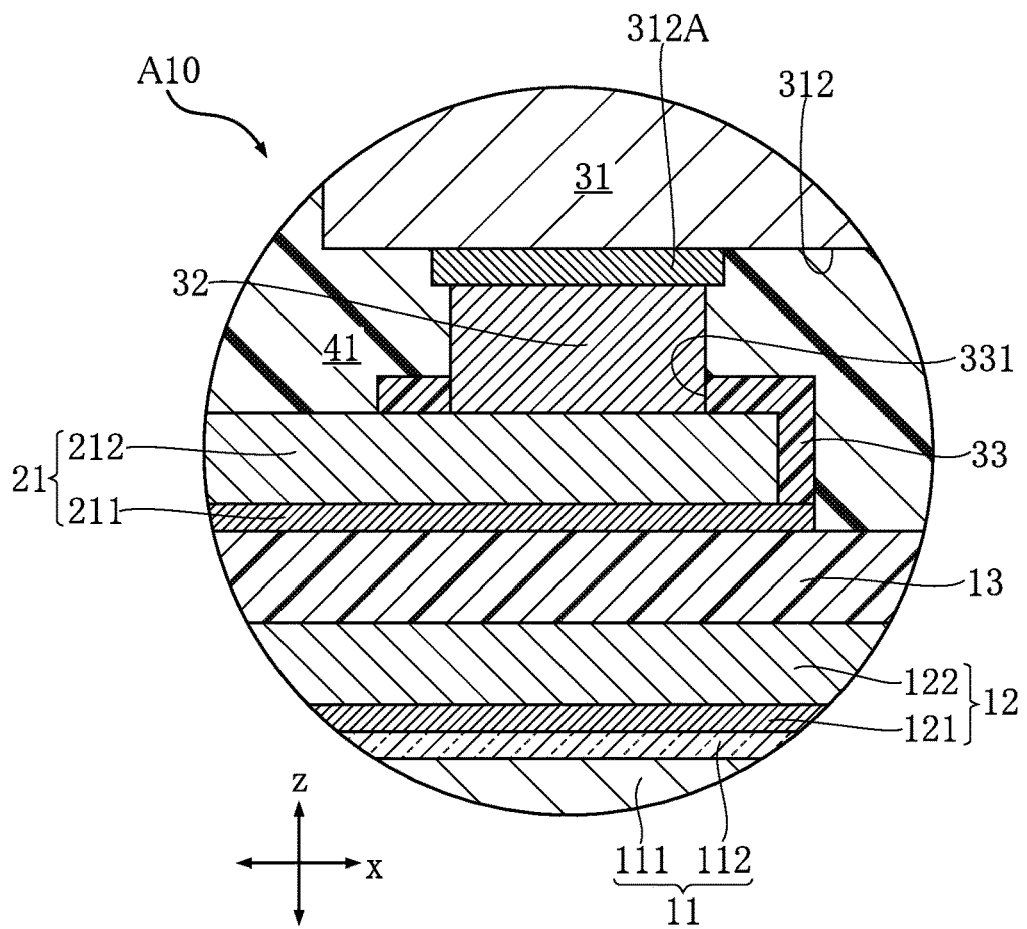
FIG. 10 is a partially enlarged view of FIG. 7.
Figure 11:
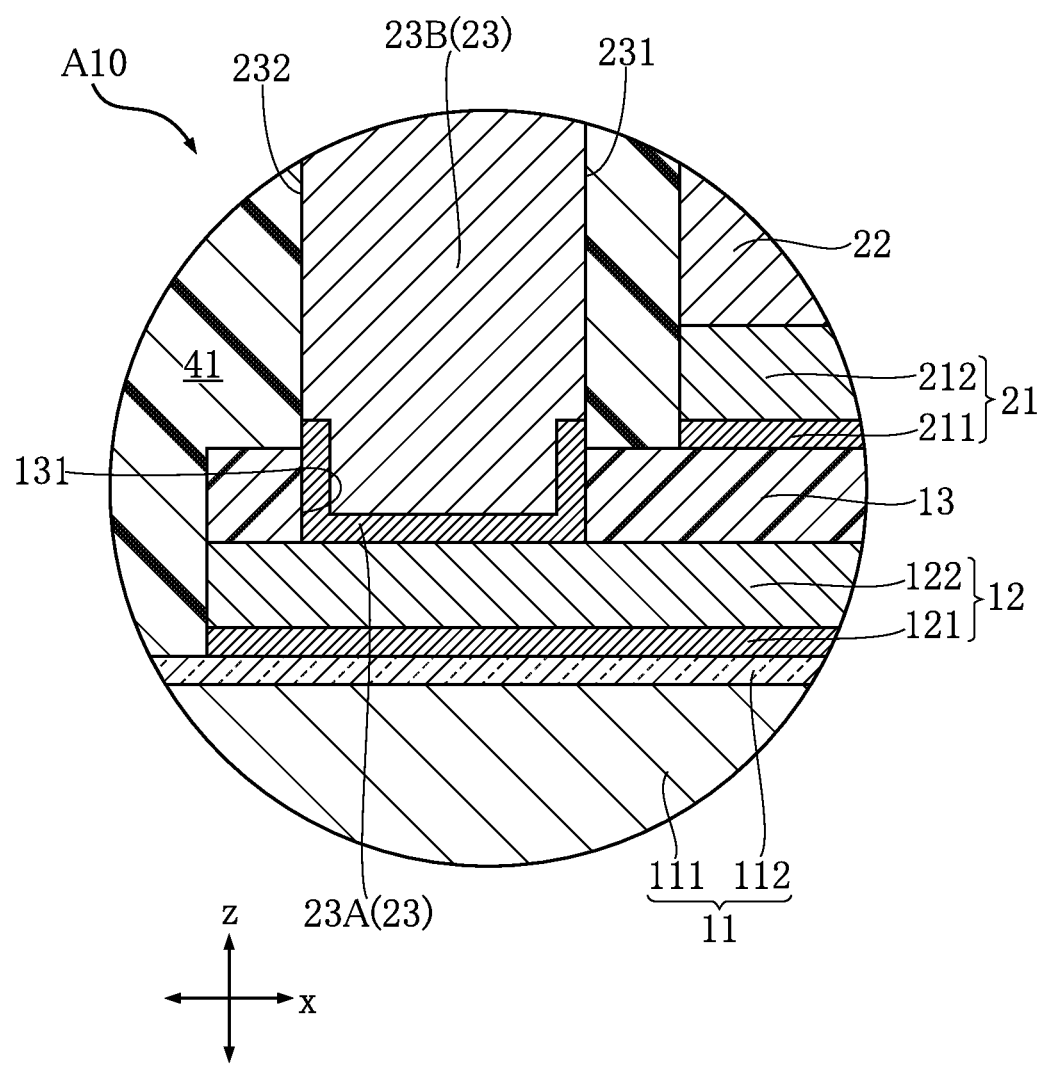
FIG. 11 is a partially enlarged view of FIG. 7.

In FIG. 1, the sealing resin 41 and the outer protective layer 42 are shown by phantom lines (long dashed double-dotted lines) representing their outlines. In FIG. 4, the semiconductor element 31 is shown by phantom lines representing its outer edge. FIGS. 7 and 8 are sectional views taken along long dashed dotted lines of FIG. 3. FIG. 10 is an enlarged view of a portion around the bonding layer 32 shown in FIG. 7. FIG. 11 is an enlarged view of a portion of the boundary between the shielding layer 12 and the frame 23.

The semiconductor device A10 shown in the figures is a resin packaged device suitable for surface mounting on the printed circuit boards of various electronic devices. As shown in FIGS. 1 to 4, the semiconductor device A10 is rectangular as viewed in the thickness direction z of the semiconductor element 31. For purposes of description, in addition, the longitudinal direction of the semiconductor device A10 in plan view and perpendicular to the thickness direction z is defined as a "first direction x". The short direction of the semiconductor device A10 in plan view and perpendicular to both the thickness direction and the first direction is defined as a "second direction y". Note that the phrase "thickness direction" used in the appended claims refers to the thickness direction z of the semiconductor element 31. The phrase "as viewed in the thickness direction" used in the appended claims is simply "in plan view" in the following description.

As shown in FIGS. 1 and 5 to 9, the substrate 11 is used as a mounting base of the semiconductor device A10, on which the shielding layer 12, the isolation layer 13, the wiring layer 21, the semiconductor element 31, the electroconductive pillars 22, the frame 23 and the sealing resin 41 are mounted. The substrate 11 includes a base member 111 and an insulating film 112. The base member 111 is made of an intrinsic semiconductor material, which is silicon (Si) in the semiconductor device A10. The insulating film 112 coats one surface of the base member 111 facing in the thickness direction z. The insulating film 112 is electrically insulating. In the semiconductor device A10, the insulating film 112 may be made of $SiO_2$.

As shown in FIGS. 5 to 9, the shielding layer 12 is in contact with the insulating film 112, so that the insulating film 112 is located between the base member 111 and the shielding layer 12 in the thickness direction z. The shielding layer 12 is electrically conductive. As shown in FIGS. 10 and 11, the shielding layer 12 of the semiconductor device A10 is composed of an underlying layer 121 and a plating layer 122 disposed on the underlying layer 121. The underlying layer 121 is composed of a titanium (Ti) layer disposed in contact with the insulating film 112 and a copper (Cu) layer disposed on the Ti layer. The plating layer 122 is made of Cu.

As shown in FIGS. 1 and 4 to 9, the isolation layer 13 is disposed on the shielding layer 12. The isolation layer 13 is electrically insulating. In the semiconductor device A10, the isolation layer 13 is in contact with the plating layer 122 of the shielding layer 12. As shown in FIG. 4, the isolation layer 13 has a frame-shaped opening 131 formed therethrough in the thickness direction. That is, the isolation layer 13 has an inner region surrounded by the opening 131 and an outer region surrounding the opening 131 in plan view. In the semiconductor device A10, the isolation layer 13 is made of a photosensitive polyimide. Alternatively, the isolation layer 13 may be made of $Si_3N_4$. In the semiconductor device A10, the outer edge of the isolation layer 13 coincides with the outer edge of the shielding layer 12 in plan view.

As shown in FIGS. 1, 3, 4 and 7 to 9, the wiring layer 21 is disposed on the inner region of the isolation layer 13 (the region surrounded by the opening 131 in plan view). The wiring layer 21 forms conductive paths between the semiconductor element 31 mounted thereon and the electroconductive pillars 22. As shown in FIGS. 10 and 11, the wiring layer 21 of the semiconductor device A10 is composed of an underlying layer 211 and a plating layer 212 that is disposed on the underlying layer 211. The underlying layer 211 is composed of a Ti layer disposed in contact with the isolation layer 13 and a Cu layer disposed on the Ti layer. The plating layer 122 is made of Cu. The wiring layer 21 is electrically isolated from the shielding layer 12 by the isolation layer 13.

Figure 9:
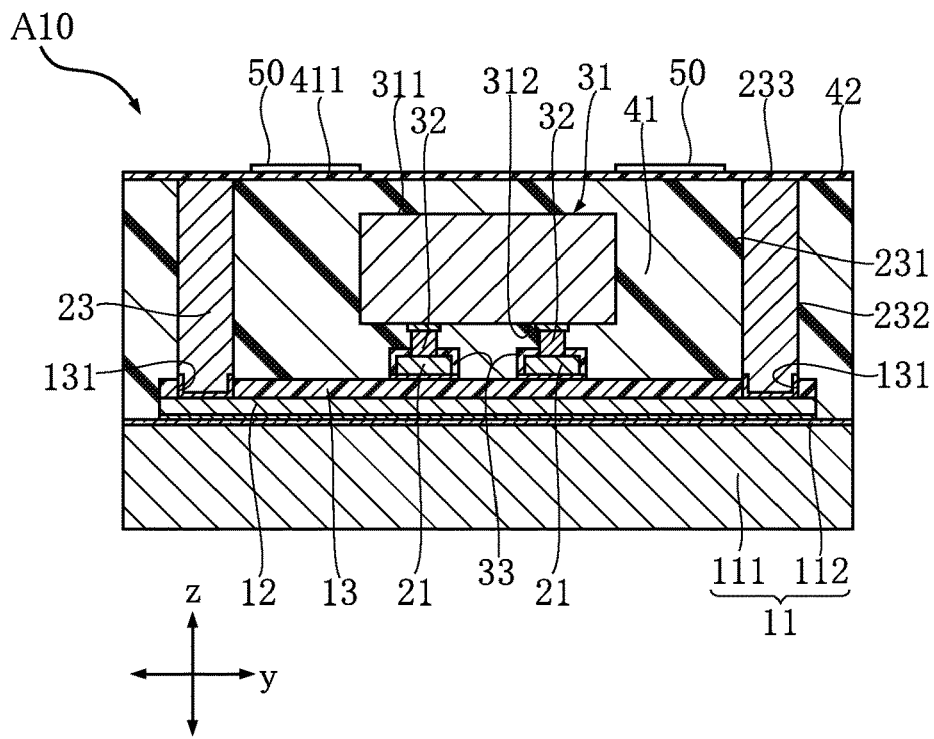
FIG. 9 is a sectional view taken along line IX-IX of FIG. 3.

As shown in FIGS. 1, 3, 4 and 7 to 9, the semiconductor element 31 is mounted on the wiring layer 21. The semiconductor element 31 included in the semiconductor device A10 may be an element that tends to be affected by external electromagnetic radiation or to affect nearby electronic devices by emitting electromagnetic radiation. One example of such a semiconductor element 31 is a switching element for use in a power semiconductor device. The semiconductor element 31 has an element front surface 311 and an element back surface 312 facing in opposite directions to each other in the thickness direction z. The element front surface 311 faces upward as seen in FIGS. 7 to 9. The element back surface 312 faces downward as seen in FIGS. 7 to 9 and toward the wiring layer 21. As shown in FIG. 10, a plurality of electrodes 312A are disposed on the element back surface 312. The electrodes 312A are external terminals of the circuits (not illustrated) formed in the semiconductor element 31. The electrodes 312A may be made of aluminum (Al), for example.

As shown in FIGS. 7 to 10, the bonding layer 32 is disposed between the wiring layer 21 and each electrode 312A on the element back surface 312 in the thickness direction z. The bonding layer 32 is in contact with both the wiring layer 21 and the electrodes 312A. The bonding layer 32 is electrically conductive and thus electrically connects the wiring layer 21 and the semiconductor element 31. In the semiconductor device A10, the bonding layer 32 is composed of a laminate of a nickel (Ni) layer and a tin (Sn) alloy layer. The Ni layer is in contact with the wiring layer 21, and the Sn alloy layer is in contact with the electrodes 312A. Typical materials of the Sn alloy layer include an alloy of tin and sliver (Sn—Ag alloy) and an alloy of tin and antimony (Sn—Sb alloy).

As shown in FIG. 4, the inner protective layer 33 has a plurality of regions each of which surrounds the bonding layer 32 and covers at least a region of the wiring layer 21 in plan view. The inner protective layer 33 is electrically insulating. In the semiconductor device A10, the inner protective layer 33 is made of a photosensitive polyimide. The inner protective layer 33 has openings 331 formed therethrough in the thickness direction z. In plan view, the regions of the bonding layer 32 are contained in the openings 331.

As shown in FIGS. 1, 3, 4, 7 to 9, each electroconductive pillar 22 stands on the wiring layer 21 in the direction in which the element front surface 311 is facing in the thickness direction z. The electroconductive pillars 22 are spaced apart from the semiconductor element 31. In the semiconductor device A10, each electroconductive pillars 22 has the shape of a polygonal prism. The electroconductive pillars 22 are made of a metal containing Cu. In the semiconductor device A10, the electroconductive pillars 22 are made of Cu. Each electroconductive pillar 22 has a side surface 221 and an end surface 222. The side surface 221 stands in the thickness direction z. In the semiconductor device A10, each pillar 22 has four flat side surfaces 221. The end surface 222 faces in the direction in which the element front surface 311 is facing and intersects the side surfaces 221.

As shown in FIGS. 1 to 3 and 5 to 9, the frame 23 is disposed on the region of the shielding layer 12 exposed through the opening 131 of the isolation layer 13 and stands in the direction in which the element front surface 311 is facing in the thickness direction z. In plan view, the frame 23 surrounds the semiconductor element 31 and the electroconductive pillars 22. In plan view, the frame 23 has a rectangular inner edge and a rectangular outer edge. The frame 23 is electrically conductive and thus in electrical communication with the shielding layer 12.

As shown in FIG. 11, the frame 23 of the semiconductor device A10 is composed of an underlying part 23A and a general part 23B. The underlying part 23A is in contact with the isolation layer 13 (whose walls defining the opening 131) and the shielding layer 12 exposed in the opening 131. The underlying part 23A has a composition identical to the composition of the underlying layer 211 of the wiring layer 21. The general part 23B is the body of the frame 23 and integral with the underlying part 23A. The general part 23B is made of a metal containing Cu. That is, the electroconductive pillars 22 and the frame 23 contain the same metal. In the semiconductor device A10, the general part 23B is made of Cu.

As shown in FIGS. 1 to 3 and 7 to 9, the frame 23 has an inner surface 231, an outer surface 232 and a top surface 233. The inner surface 231 stands in the thickness direction z and faces the semiconductor element 31. In the semiconductor device A10, the frame 23 has four inner surfaces 231. The outer surface 232 stands in the thickness direction z and faces in the opposite direction of the inner surface 231. In the semiconductor device A10, the frame 23 has four outer surfaces 232. The top surface 233 faces in the direction in which the element front surface 311 is facing and intersects the inner surfaces 231 and the outer surfaces 232. The top surface 233 has the shape of a frame and is flush with the end surfaces 222 of the electroconductive pillars 22.

As shown in FIGS. 1, 2 and 5 to 9, the sealing resin 41 covers the wiring layer 21 and the semiconductor element 31. In the semiconductor device A10, the sealing resin 41 also covers the side surfaces 221 of each electroconductive pillar 22 and the inner surfaces 231 and the outer surfaces 232 of the frame 23. The sealing resin 41 is electrically insulating. The sealing resin 41 may be a black epoxy resin, for example. The sealing resin 41 has a mounting surface 411 facing in the direction in which the element front surface 311 is facing. When the semiconductor device A10 is mounted on a wiring circuit board, the mounting surface 411 will be the surface that faces the wiring circuit board. The mounting surface 411 is flush with the end surfaces 222 of the electroconductive pillars 22 and the top surface 233 of the frame 23.

Figure 5:
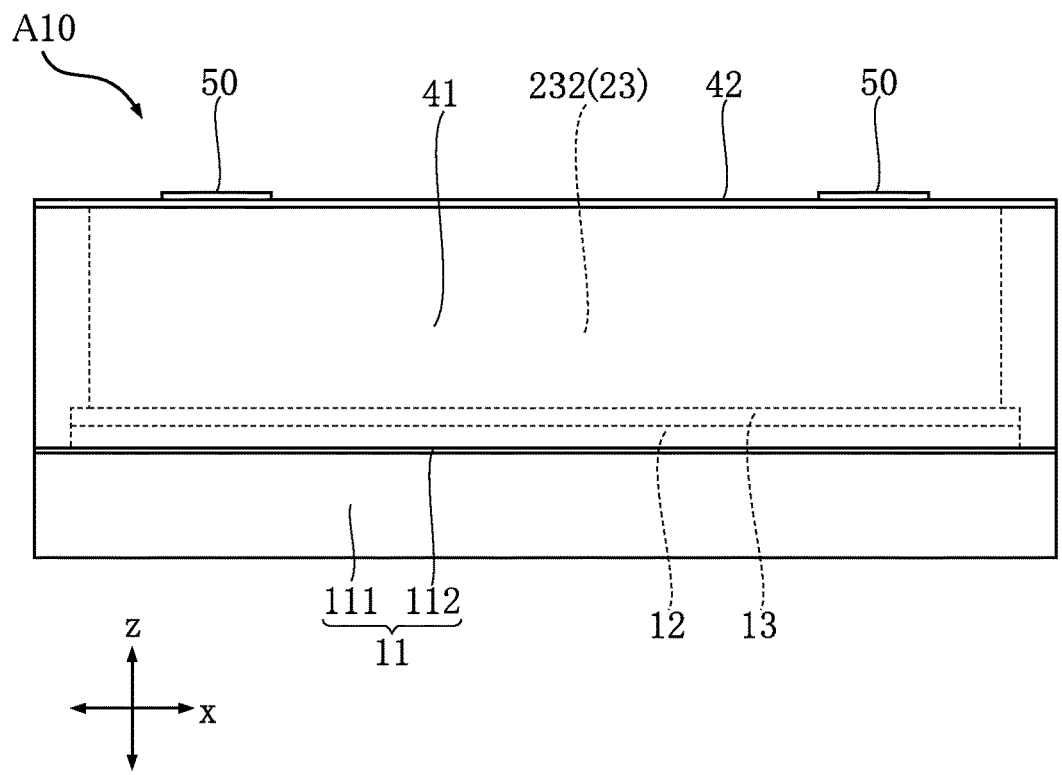
FIG. 5 is a front view of the semiconductor device shown in FIG. 1.
Figure 6:
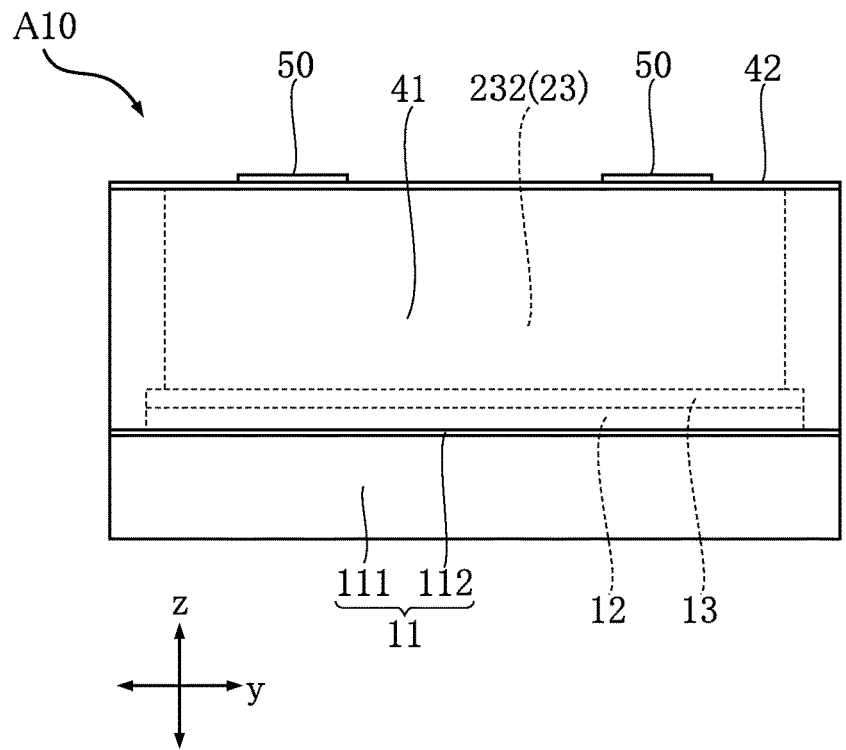
FIG. 6 is a right-side view of the semiconductor device shown in FIG. 1.

As shown in FIGS. 1, 5 and 6, the sealing resin 41 surrounds the shielding layer 12 and the frame 23 along their outer edges in plan view. In other words, the shielding layer 12 is not exposed on the side surfaces of the semiconductor device A10.

Figure 2:
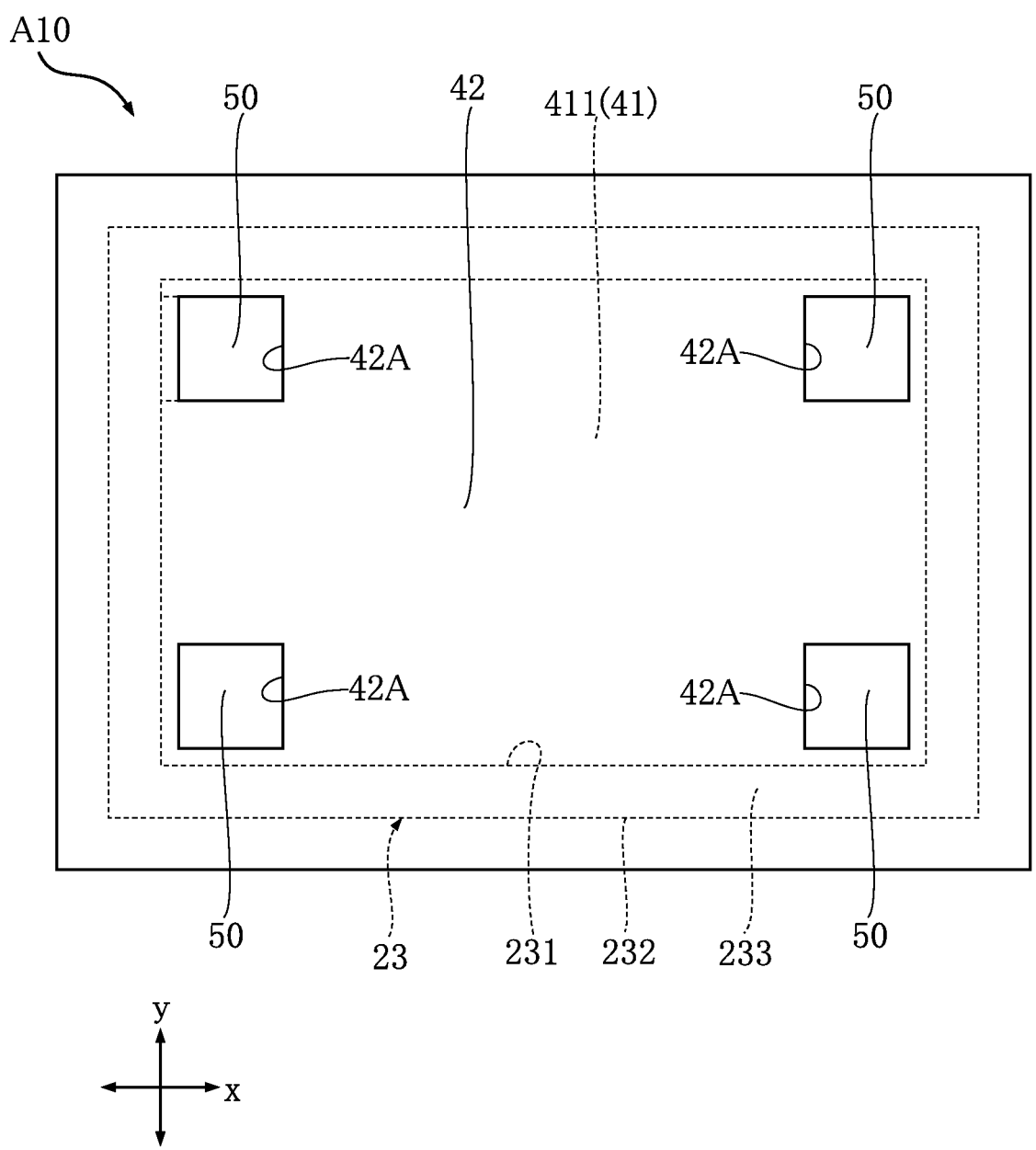
FIG. 2 is a plan view of the semiconductor device shown in FIG. 1.

As shown in FIGS. 1, 2 and to 5 to 9, the outer protective layer 42 covers the mounting surface 411 of the sealing resin 41 and the top surface 233 of the frame 23. The outer protective layer 42 has a plurality of openings 42A formed therethrough in the thickness direction z to expose the end surfaces 222 of the electroconductive pillars 22. In the semiconductor device A10, each opening 42A is rectangular in plan view. The outer protective layer 42 is electrically insulating. In the semiconductor device A10, the outer protective layer 42 is made of a photosensitive polyimide.

As shown in FIGS. 1, 2 and 5 to 9, the terminals 50 are exposed to the outside and electrically connected to the end surfaces 222 of the electroconductive pillars 22. When the semiconductor device A10 is mounted on the wiring circuit board, the terminals 50 will be placed in contact with the wiring of the circuit board. In the semiconductor device A10, the terminals 50 are in contact with the end surfaces 222 of the electroconductive pillars 22. In the semiconductor device A10, in addition, the terminals 50 are formed by depositing a plating layer on the end surfaces 222. The plating layer may be composed of a Ni layer, a palladium (Pd) layer and a gold (Au) layer laminated on one another. Specifically, the plating layer is composed of the Ni layer, the Pd layer and the Au laminated in the order stated. The Ni layer is in contact with the end surfaces 222. Note that the Pd layer may be omitted from the metal layers forming the plating layer.

Once the semiconductor device A10 is mounted on, for example, a printed circuit board, the frame 23 can be electrically connected to an external ground terminal (GND) of the printed circuit board. In the semiconductor device A10, the frame 23 is electrically connected to one of the electroconductive pillars 22. In FIGS. 3 and 8, the electroconductive pillar 22 shown at the top left in FIG. 3 is the one electrically connected to the frame 23. The electroconductive pillar 22 electrically connected to the frame 23 has a connection part 22A. In the semiconductor device A10, the connection part 22A is in contact with one side surface 221 of the relevant electroconductive pillar 22 and one inner surface 231 of the frame 23. Thus, once the semiconductor device A10 is mounted on a wiring circuit board, the electroconductive pillar 22 connected to the frame 23 can be electrically connected to an external terminal through the terminal 50. That is, the frame 23 of the semiconductor device A10 is electrically connectable to an external ground terminal.

The following now describes an example of a method for manufacturing semiconductor devices A10 with reference to FIGS. 12 to 28.

The sections shown in FIGS. 12 to 27 are taken along the same line as the section shown in FIG. 8. The phrase "thickness direction" used in the appended claims refers to the thickness direction z of a semiconductor element 831. The phrase "as viewed in the thickness direction" used in the appended claims is simply "in plan view" in the following description. The "first direction x" shown in these figures are defined similarly to the first direction shown in FIGS. 1 to 11.

Figure 12:
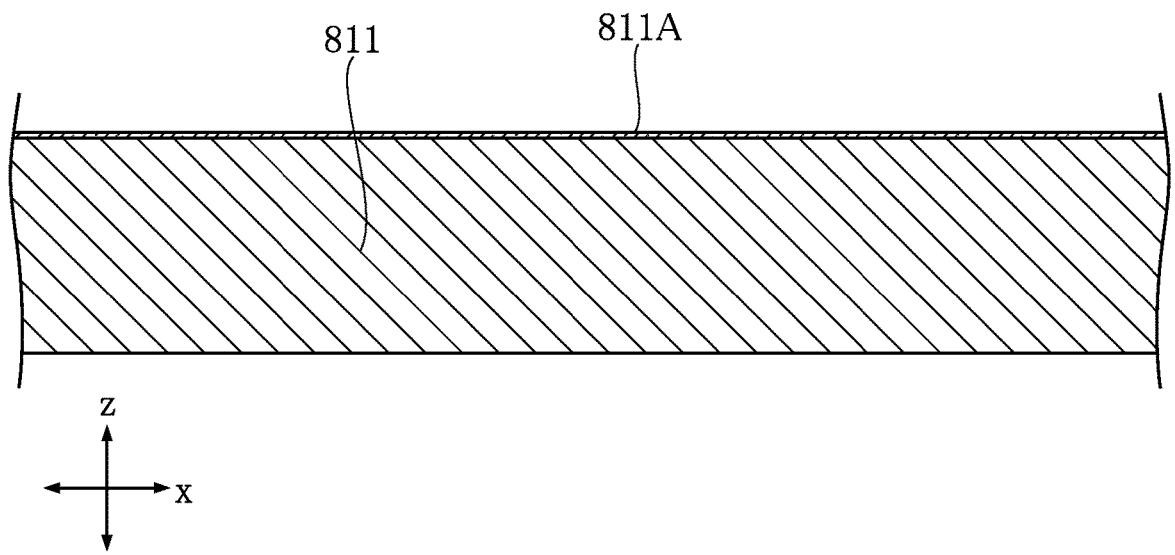
FIG. 12 is a sectional view illustrating a method for manufacturing the semiconductor device shown in FIG. 1.

First, as shown in FIG. 12, a base member 811 is processed to form an insulating film 811A on one surface thereof facing in the thickness direction z. The base member 811 and the insulating film 811A respectively correspond to the base member 111 and the insulating film 112 forming the substrate 11 of the semiconductor device A10. The base member 811 is made of an intrinsic semiconductor material, which is Si in the semiconductor device A10. That is, a Si wafer commonly used in the field of semiconductor manufacturing may be used as the base member 811. The insulating film 811A is formed by thermal oxidation. Consequently, the composition of the insulating film 811A of the semiconductor device A10 is $SiO_2$.

Figure 13:
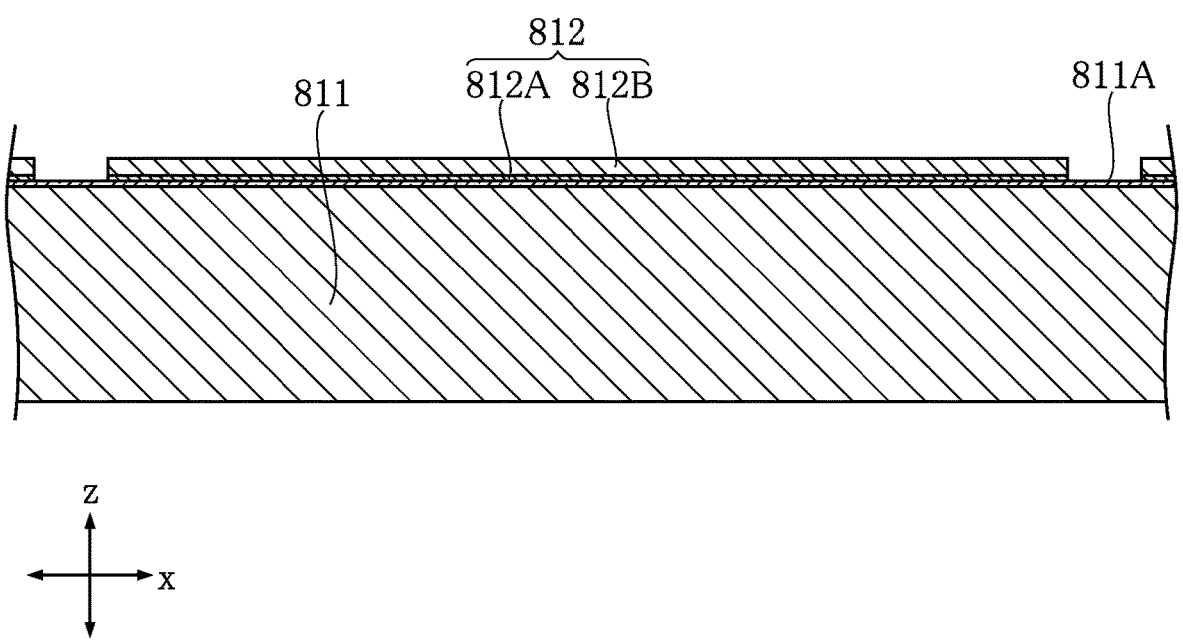
FIG. 13 is a sectional view illustrating the method for manufacturing the semiconductor device shown in FIG. 1.

Next, as shown in FIG. 13, an electrically conductive shielding layer 812 is deposited on the insulating film 811A of the base member 811. The shielding layer 812 corresponds to the shielding layer 12 of the semiconductor device A10. In the semiconductor device A10, the shielding layer 812 is composed of an underlying layer 812A and a plating layer 812B. The underlying layer 812A is composed of a Ti layer and a Cu layer deposited by sputtering. The Ti layer is formed on the insulating film 811A, and the Cu layer is formed on the Ti layer. The plating layer 812B is made of Cu. The plating layer 812B is formed on the Cu layer of the underlying layer 812A by electroplating using the underlying layer 812A as a conductive path. Once the shielding layer 812 is formed on the base member 811, regions of the shielding layer 812 are removed by etching. Specifically, the regions of the shielding layer 812 are removed in the shape of grid lines extending in the first direction x and the second direction y. By removing the regions of the shielding layer 812 in this way, the shielding layer 812 remaining on the base member 811 is divided into a plurality of separate regions for a plurality of semiconductor devices A10.

Figure 14:
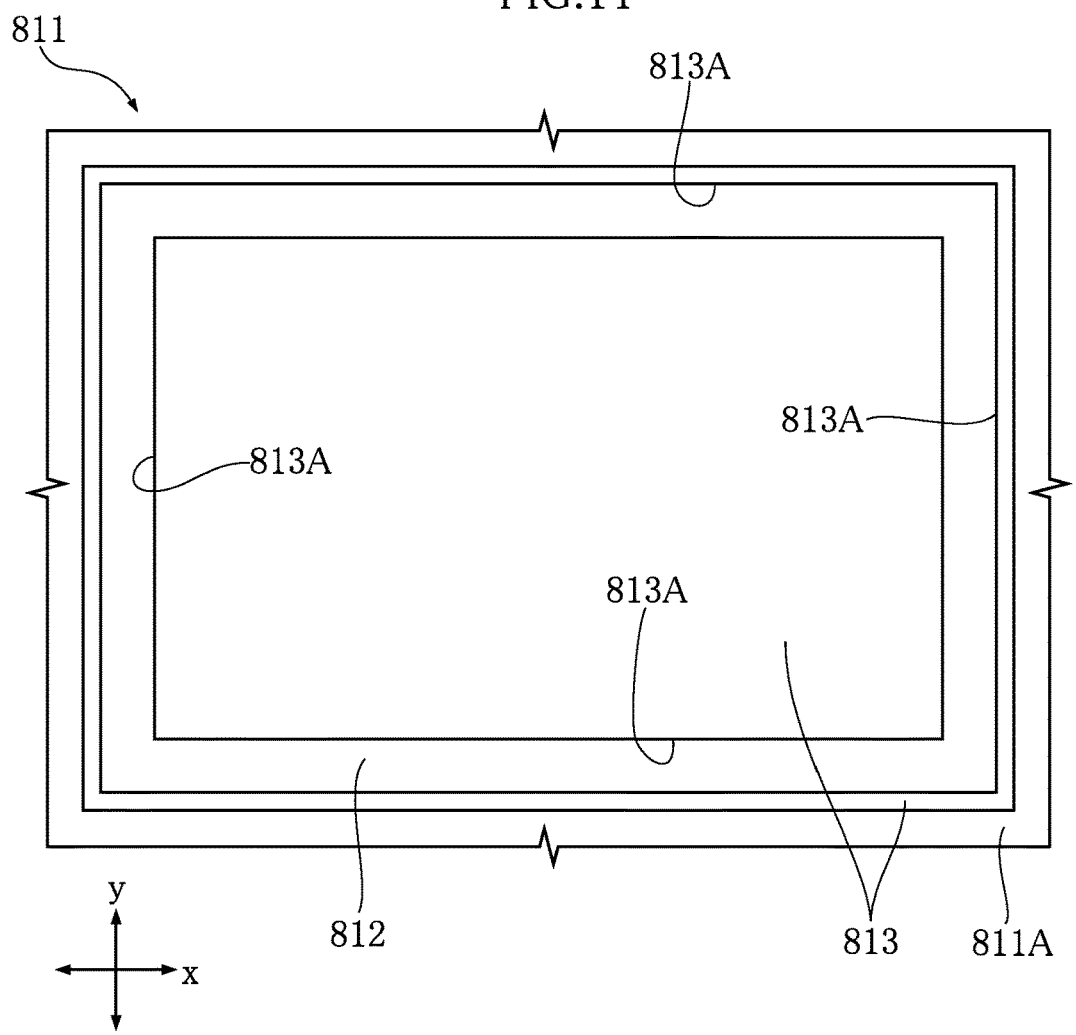
FIG. 14 is a sectional view illustrating the method for manufacturing the semiconductor device shown in FIG. 1.
Figure 15:
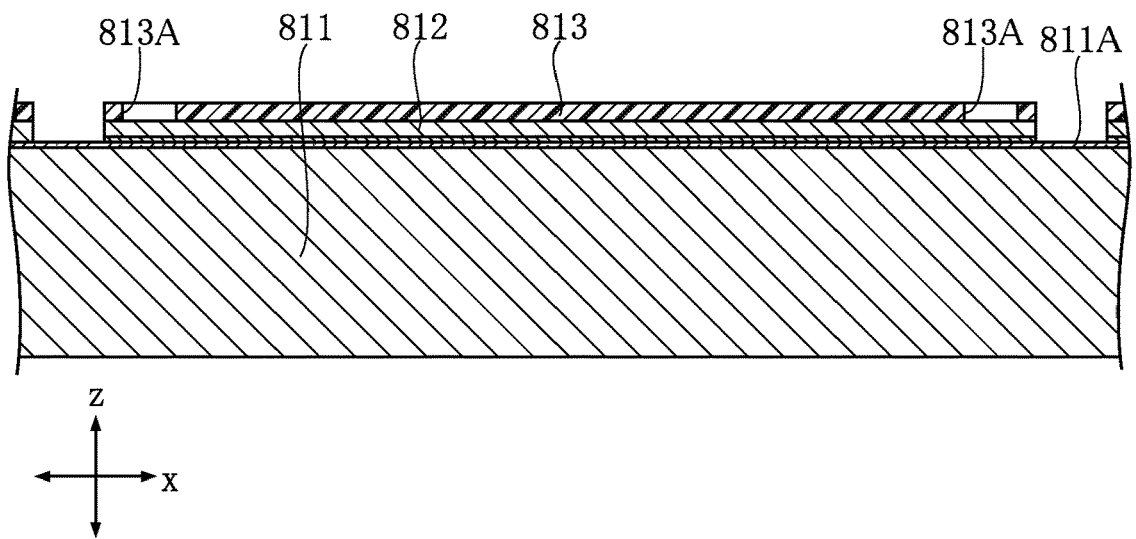
FIG. 15 is a sectional view illustrating the method for manufacturing the semiconductor device shown in FIG. 1.

Next, as shown in FIGS. 14 and 15, an isolation layer 813 is deposited on the shielding layer 812, and then an opening 813A is formed through the isolation layer 813. The isolation layer 813 corresponds to the isolation layer 13 of the semiconductor device A10. In the semiconductor device A10, the isolation layer 813 is made of a photosensitive polyimide. The isolation layer 813 is formed on the shielding layer 812 by coating using, for example, a spin coater. The opening 813A is formed by the exposure and development processes of photolithography. The opening 813A is formed into a frame shape in plan view. At the time the opening 813A is formed, regions of the isolation layer 813 directly on the insulating film 811A are also removed. In this way, the isolation layer 813 is left unremoved on the separate regions of the shielding layer 812. In addition, the outer edge of each unremoved region of the isolation layer 813 coincides with the outer edge of the corresponding region of the shielding layer 812.

Figure 16:
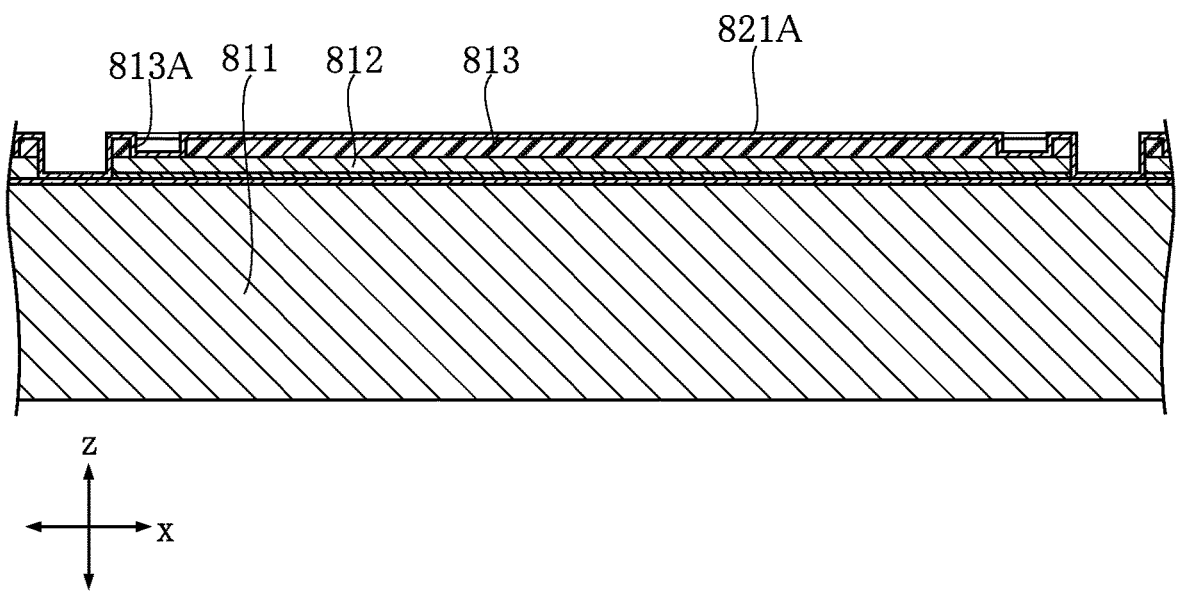
FIG. 16 is a sectional view illustrating the method for manufacturing the semiconductor device shown in FIG. 1.
Figure 17:
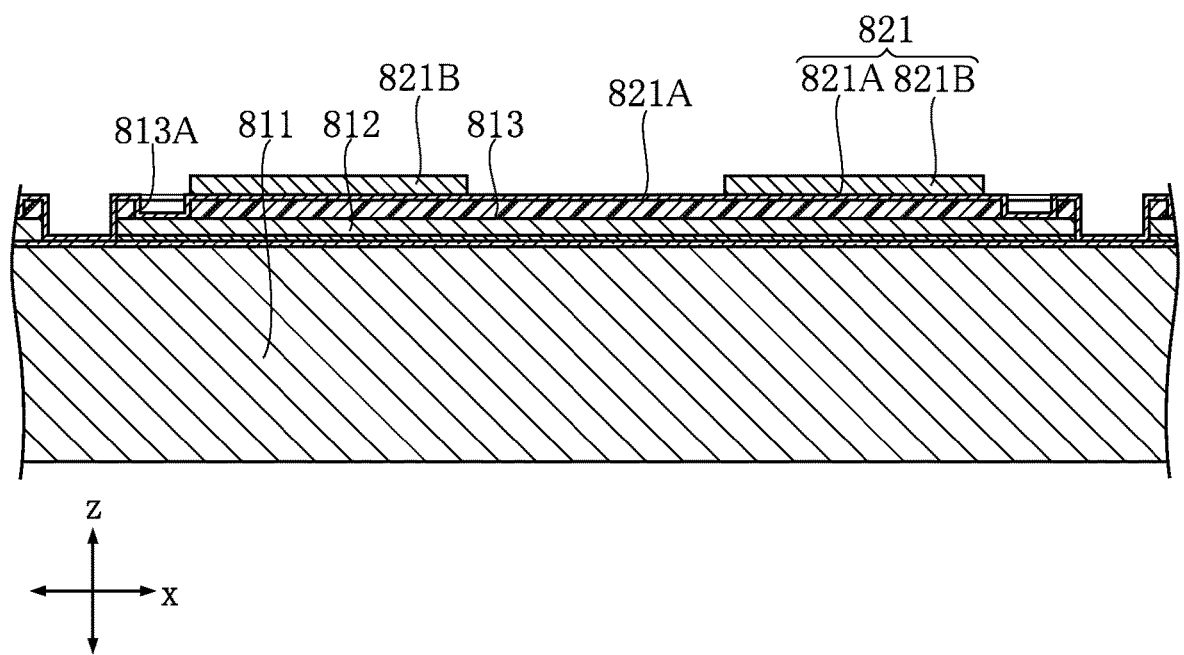
FIG. 17 is a sectional view illustrating the method for manufacturing the semiconductor device shown in FIG. 1.

Next, as shown in FIGS. 16 and 17, a wiring layer 821 is formed on the inner region of the isolation layer 813 surrounded by the opening 813A in plan view. The wiring layer 821 corresponds to the wiring layer 21 of the semiconductor device A10. In the semiconductor device A10, the wiring layer 821 is composed of an underlying layer 821A and a plating layer 821B. As shown in FIG. 16, the underlying layer 821A is first formed over the entire surface of the base member 811, including the shielding layer 812 and the isolation layer 813 deposited on the base member 811. The underlying layer 821A is composed of a Ti layer and a Cu layer deposited by sputtering. The Ti layer is formed first and then a Cu layer is formed on the Ti layer. Then, as shown in FIG. 17, the plating layer 821B is formed on the underlying layer 821A to cover desired regions inside the opening 813A in plan view. The plating layer 821B is made of Cu. The plating layer 821B is formed by electroplating using the underlying layer 821A as a conductive path, after covering appropriate regions of the underlying layer 821A with a mask formed by photolithography. After the plating layer 821B is formed, the mask covering the underlying layer 821A is removed.

Figure 18:
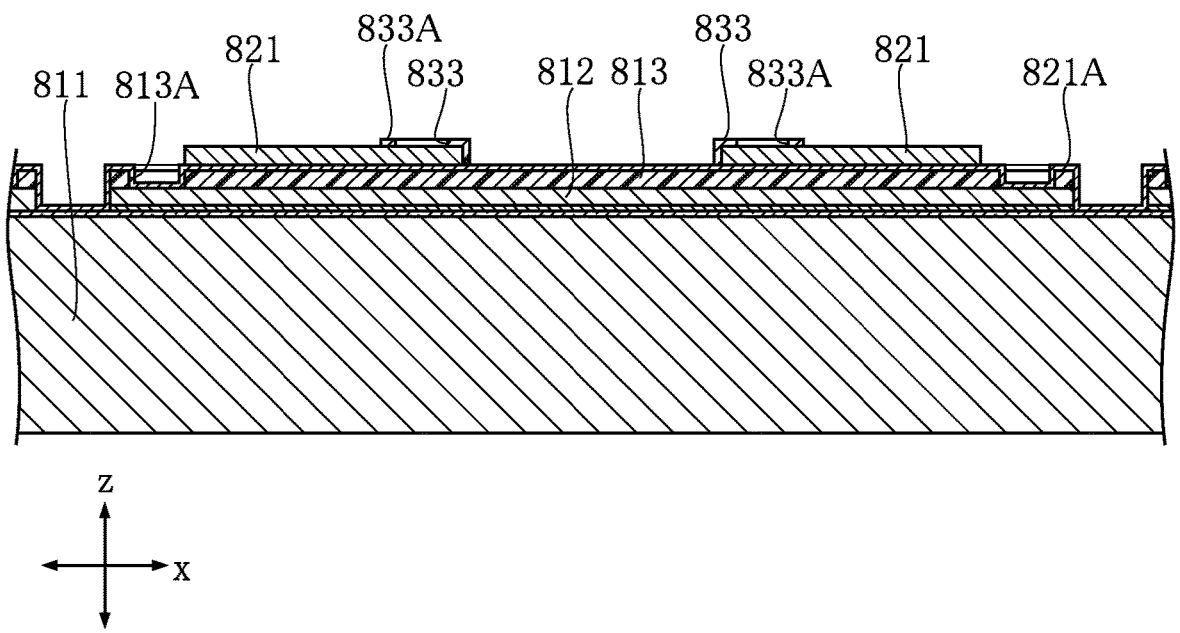
FIG. 18 is a sectional view illustrating the method for manufacturing the semiconductor device shown in FIG. 1.

Next, an inner protective layer 833 is formed as shown in FIG. 18. The inner protective layer 833 has openings 833A and covers at least a region of the wiring layer 821. The inner protective layer 833 corresponds to the inner protective layer 33 of the semiconductor device A10. In the semiconductor device A10, the inner protective layer 833 is made of a photosensitive polyimide. The inner protective layer 833 is formed with the openings 833A by applying a photosensitive polyimide on the wiring layer 821, followed by the exposure and development processes of photolithography.

Figure 19:
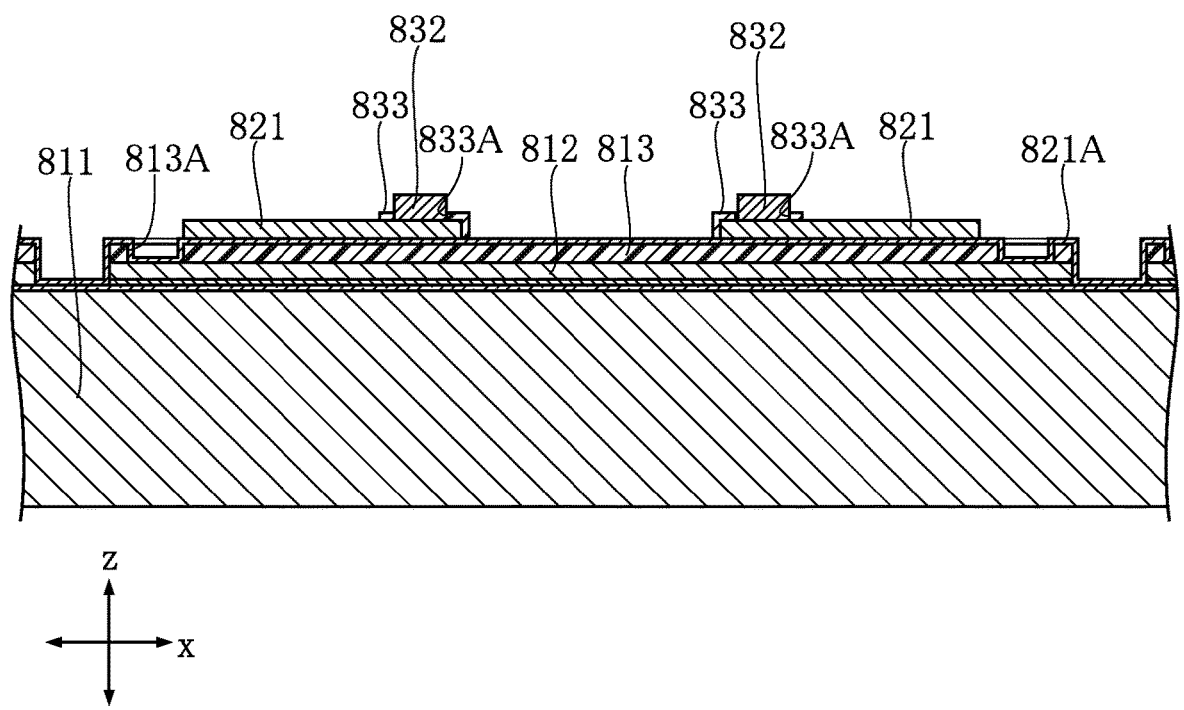
FIG. 19 is a sectional view illustrating the method for manufacturing the semiconductor device shown in FIG. 1.

Next, the bonding layer 832 is formed as shown in FIG. 19. The bonding layer 832 has a plurality of regions each bounded by an opening 833A in the inner protective layer 833. The bonding layer 832 corresponds to the bonding layer 32 of the semiconductor device A10. In the semiconductor device A10, the bonding layer 832 is composed of an Ni layer and an Sn alloy layer laminated on one another. The bonding layer 832 is formed by electroplating using the underlying layer 821A as a conductive path, after covering appropriate regions of the underlying layer 821A and the wiring layer 821 with a mask formed by photolithography. Specifically, the bonding layer 832 is formed in each opening 833A by depositing an Ni layer in contact with the underlying layer 821A of the wiring layer 821 and then depositing an Sn alloy layer on the Ni layer. After the bonding layer 832 is formed, the mask covering the underlying layer 821A and the wiring layer 821 is removed.

Figure 20:
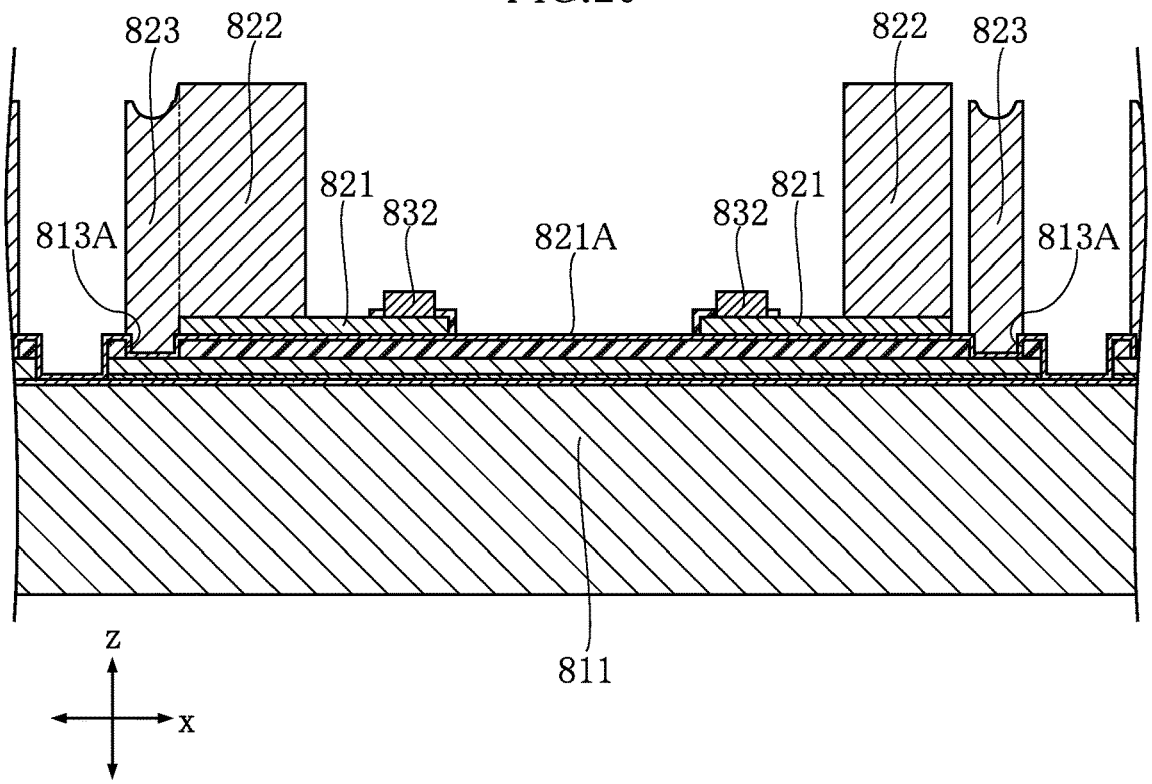
FIG. 20 is a sectional view illustrating the method for manufacturing the semiconductor device shown in FIG. 1.

Then, an electrically conductive frame 823 and a plurality of electroconductive pillars 822 are formed as shown in FIG. 20. The frame 823 stands in the thickness direction z along the opening 813A in the isolation layer 813. The electroconductive pillars 822 stand in the thickness direction z on the wiring layer 821. The frame 823 corresponds to the frame 23 of the semiconductor device A10, and the electroconductive pillar 822 to the electroconductive pillars 22 of the semiconductor device A10. In the semiconductor device A10, the frame 823 and the electroconductive pillars 822 are made of Cu. The frame 823 and the electroconductive pillars 822 are formed simultaneously by electroplating using the underlying layer 821A and the wiring layer 821 as a conductive path. Before the electroplating, a mask is created by photolithography to cover appropriate regions of the underlying layer 821A, the wiring layer 821 and the bonding layer 832. Note that one of the electroconductive pillars 822 is formed integral with the frame 823. After the frame 823 and the electroconductive pillars 822 are formed, the mask covering the underlying layer 821A, the wiring layer 821 and the bonding layer 832 is removed.

Figure 21:
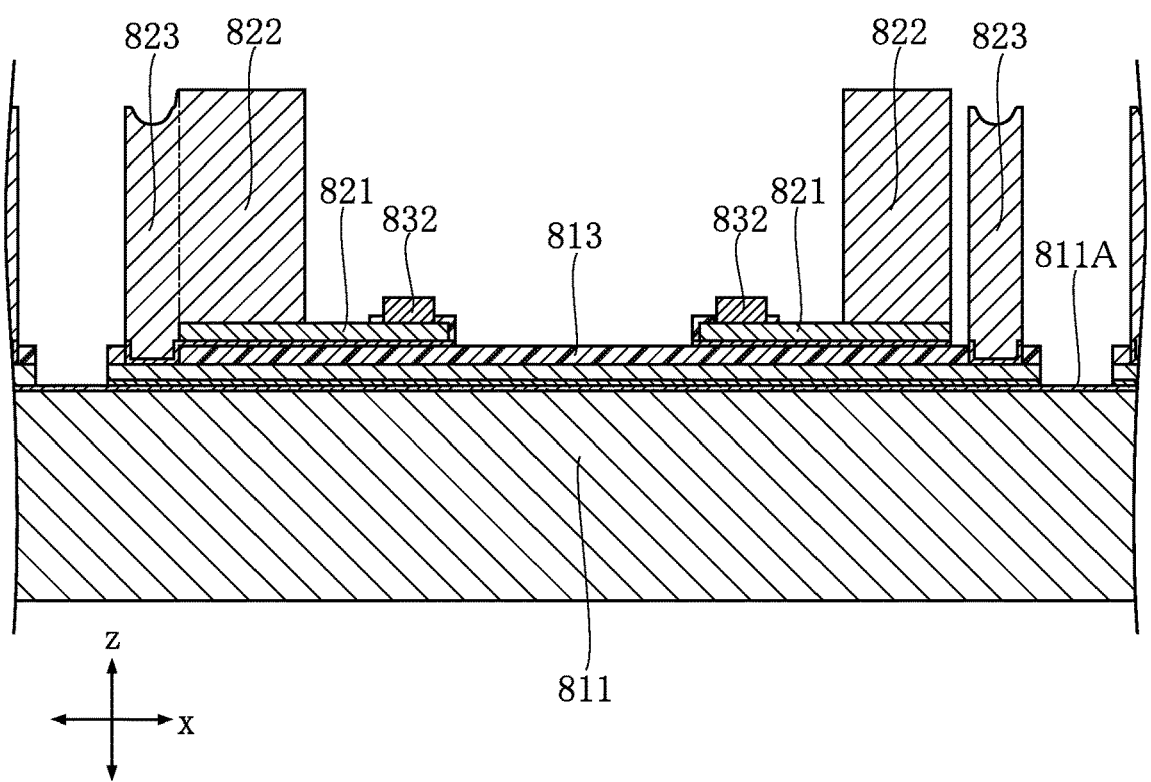
FIG. 21 is a sectional view illustrating the method for manufacturing the semiconductor device shown in FIG. 1.

Next, as shown in FIG. 21, the underlying layer 821A is etched to remove all the externally exposed regions thereof, uncovering the regions of the insulating film 811A and the isolation layer 813.

Figure 22:
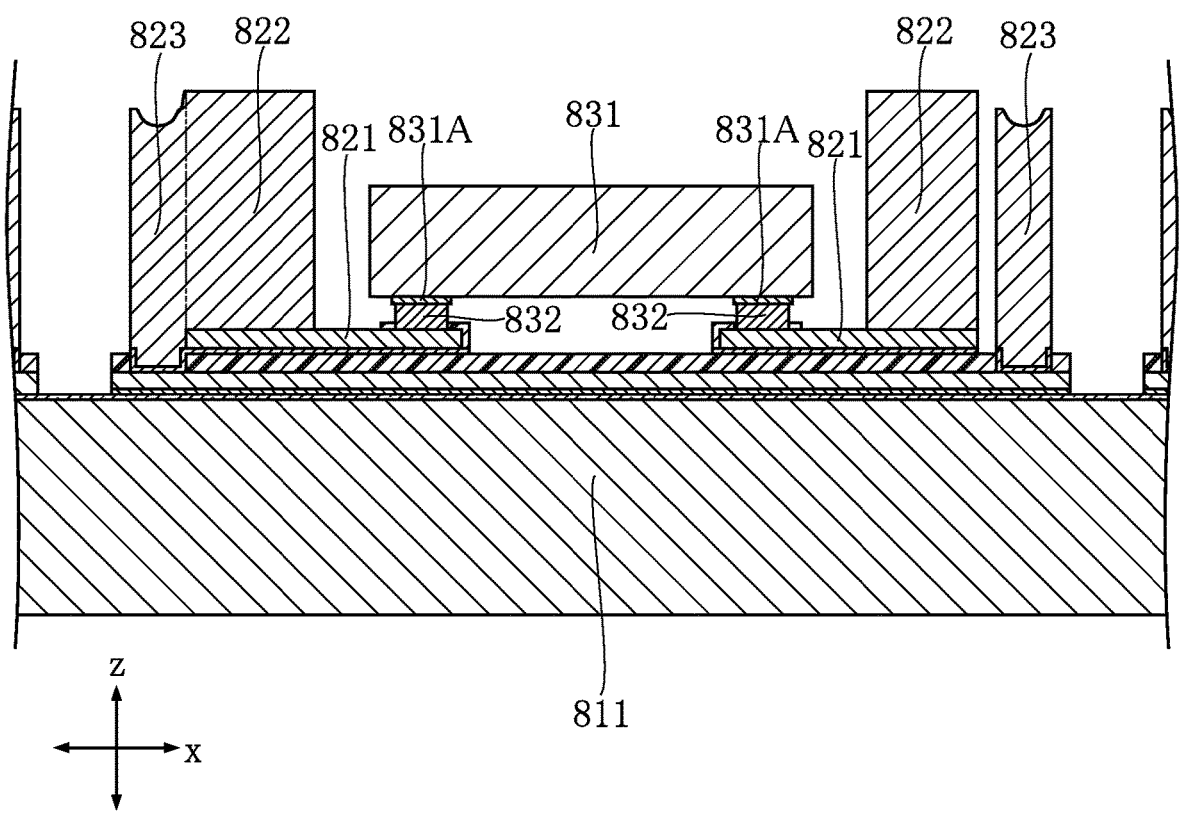
FIG. 22 is a sectional view illustrating the method for manufacturing the semiconductor device shown in FIG. 1.

Next, as shown in FIG. 22, a semiconductor element 831 is mounted on the wiring layer 821. The semiconductor element 831 corresponds to the semiconductor element 31 of the semiconductor device A10. In this step, the semiconductor element 831 is mounted by flip-chip bonding as follows. First, electrodes 831A of the semiconductor element 831 are temporarily attached to the bonding layer 832 by a flip-chip bonder. Then, the bonding layer 832 is caused to melt by reflowing. Finally, the bonding layer 832 is cooled and solidified to bond the semiconductor element 831 to the wiring layer 821.

Figure 23:
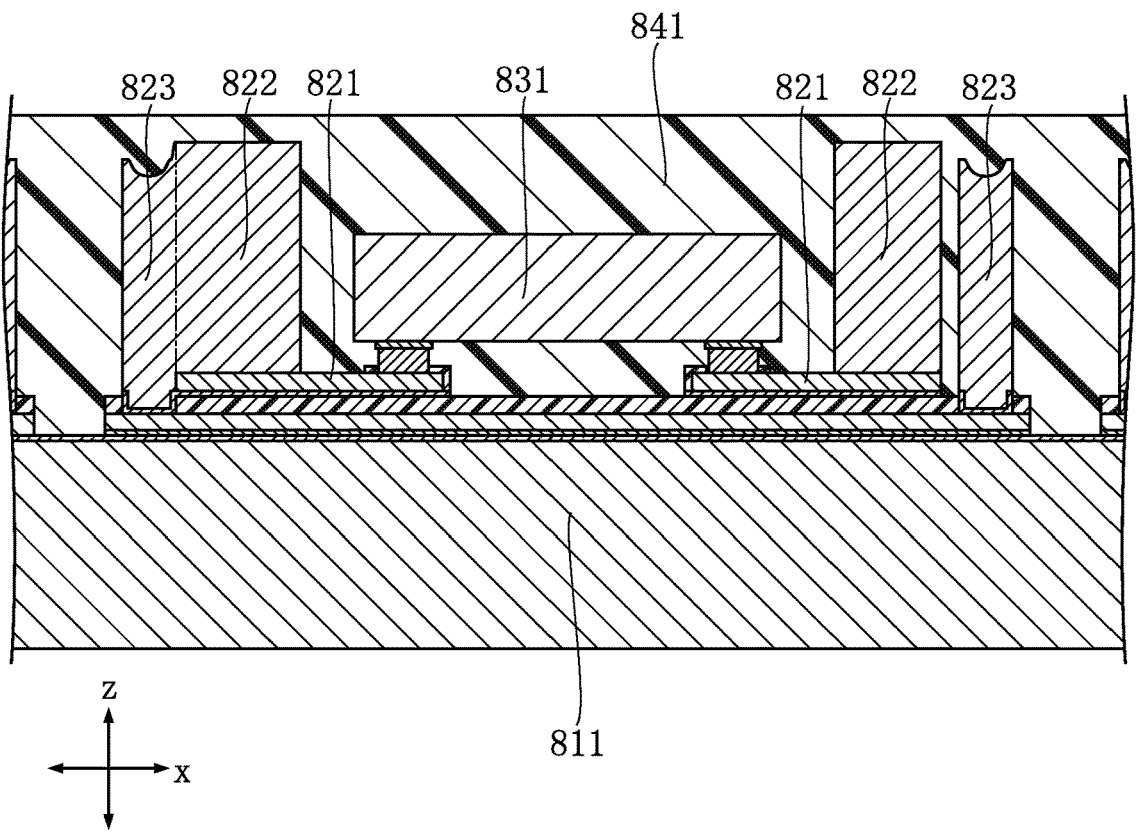
FIG. 23 is a sectional view illustrating the method for manufacturing the semiconductor device shown in FIG. 1.

Then, as shown in FIG. 23, a sealing resin 841 is formed to cover the wiring layer 821, the semiconductor element 831 and the electroconductive pillars 822. The sealing resin 841 corresponds to the sealing resin 41 of the semiconductor device A10. In the semiconductor device A10, the sealing resin 841 is a black epoxy resin. The sealing resin 841 is formed by compression molding.

Figure 24:
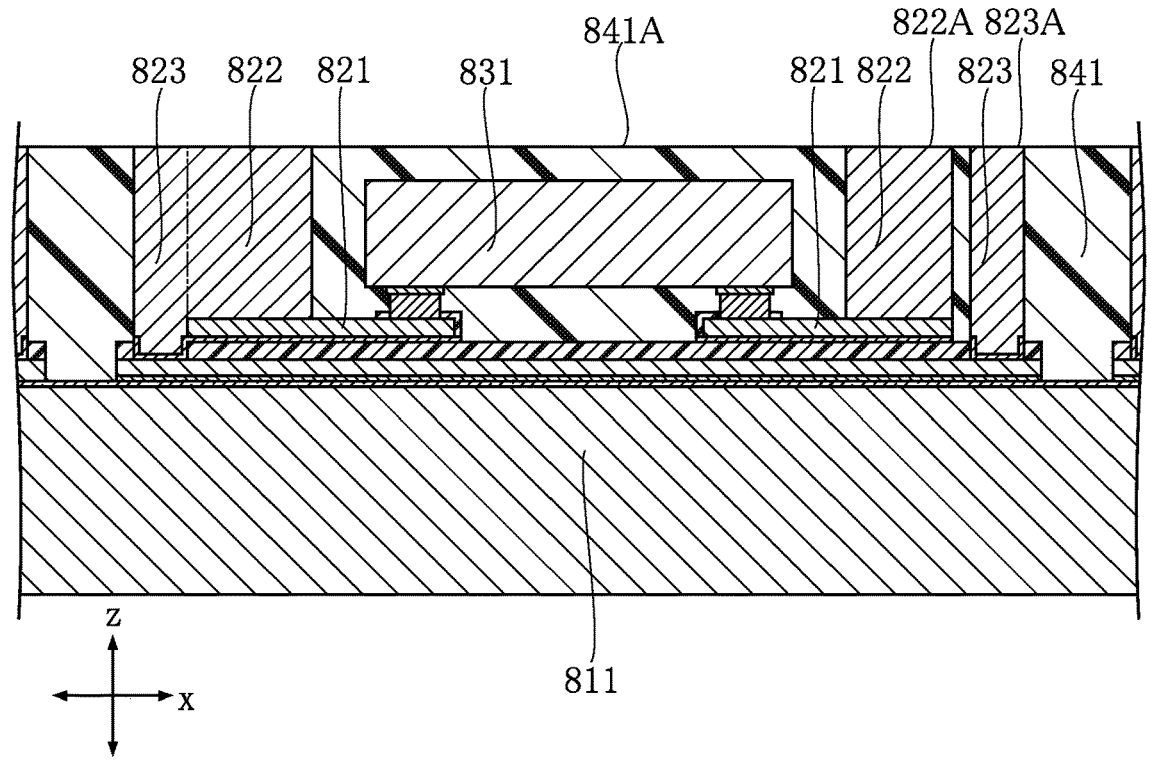
FIG. 24 is a sectional view illustrating the method for manufacturing the semiconductor device shown in FIG. 1.

Next, as shown in FIG. 24, a portion of the sealing resin 841 is removed by mechanical grinding in the thickness direction z, until portions of the electroconductive pillars 822 and the frame 823 are exposed from the sealing resin 841. In this step, the portion of the sealing resin 841 are removed along with portions of the electroconductive pillars 822 and the frame 823. By removing the portion of the sealing resin 841 in this way, the sealing resin 841 will have a mounting surface 841A that faces in the thickness direction z. On the mounding surface 811A, the end surfaces 822A of the electroconductive pillars 822 and the end surface 823A of the frame 823 are exposed.

Figure 25:
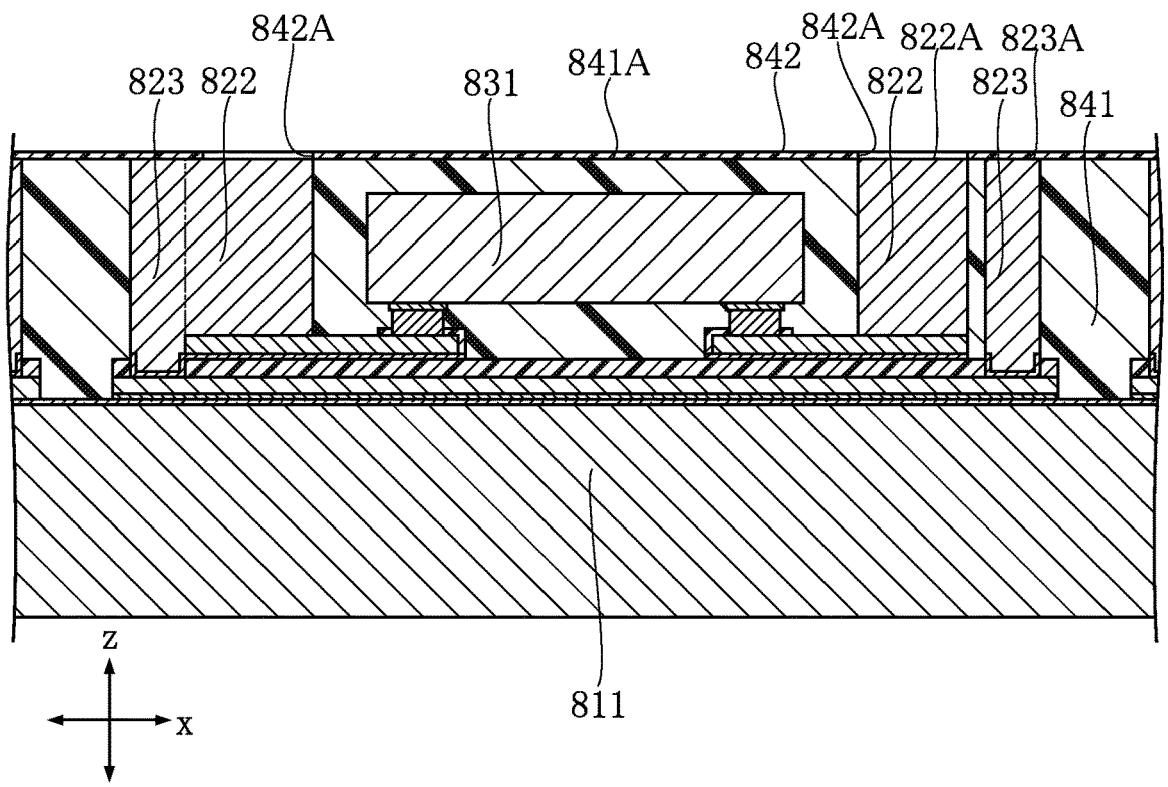
FIG. 25 is a sectional view illustrating the method for manufacturing the semiconductor device shown in FIG. 1.

Next, an outer protective layer 842 is formed with openings 842A as shown in FIG. 25. The outer protective layer 842 covers the mounting surface 841A of the sealing resin 841 and the end surface 823A of the frame 823. The outer protective layer 842 corresponds to the outer protective layer 42 of the semiconductor device A10. In the semiconductor device A10, the outer protective layer 842 is made of a photosensitive polyimide. The outer protective layer 842 is formed with the openings 842A by applying a photosensitive polyimide on the mounting surface 841A and the end surfaces 822A of the electroconductive pillars 822, followed by the exposure and development processes of photolithography. The outer protective layer 842 is formed such that the end surfaces 822A are exposed through the openings 842A.

Figure 26:
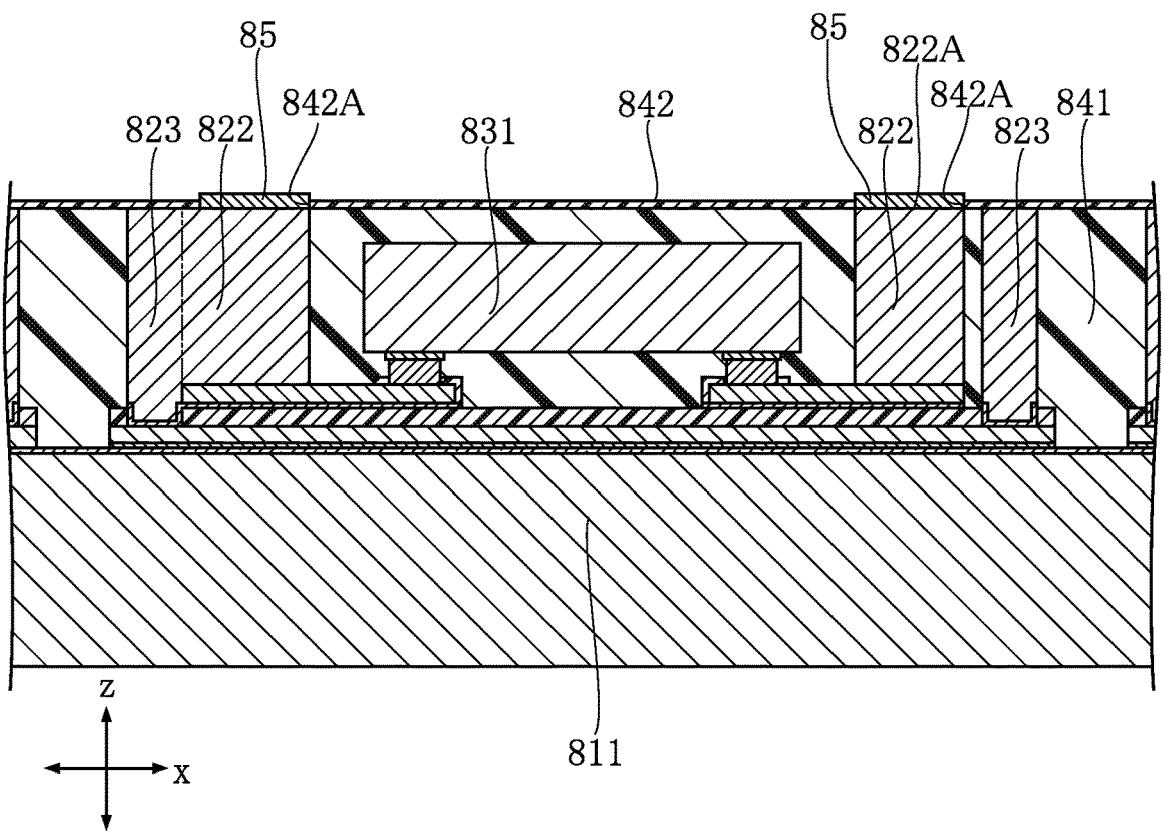
FIG. 26 is a sectional view illustrating the method for manufacturing the semiconductor device shown in FIG. 1.

Next, as shown in FIG. 26, terminals 85 are formed in electrical contact with the respective end surfaces of the electroconductive pillars 822. The terminals 85 correspond to the terminals 50 of the semiconductor device A10. In the semiconductor device A10, the terminals 85 are formed by electroless plating to deposit a plating layer on the end surfaces 822A exposed through the openings 842A in the outer protective layer 842. Specifically, the terminals 85 may be formed by laminating metal layers, such as a Ni layer, a Pd layer and a Au layer deposited in the stated order.

Figure 27:
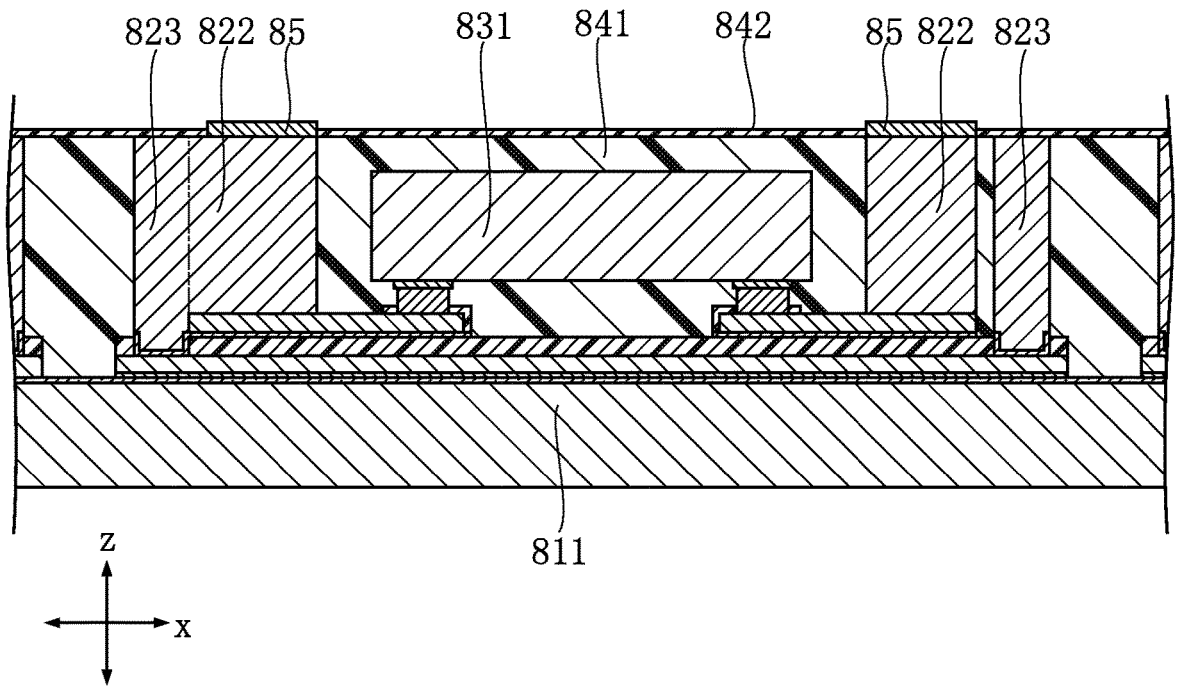
FIG. 27 is a sectional view illustrating the method for manufacturing the semiconductor device shown in FIG. 1.

Next, as shown in FIG. 27, a portion of the base member 811 is removed by mechanically grinding the base member 811 from the backside in the thickness direction z.

Figure 28:
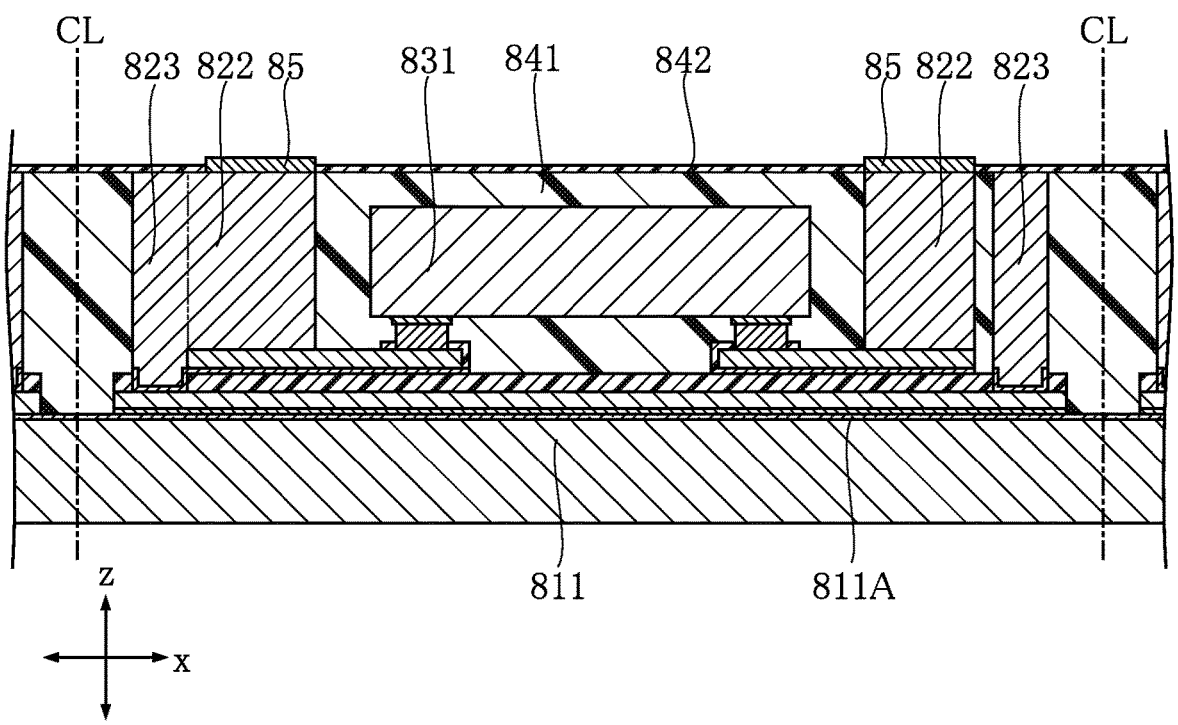
FIG. 28 is a sectional view illustrating the method for manufacturing the semiconductor device shown in FIG. 1.

Finally, as shown in FIG. 28, the base member 81, the insulating film 811A, the sealing resin 841 and the outer protective layer 842 are cut along the cutting lines CL and separated into individual pieces, each of which has one semiconductor element 831 and associated components. This cutting may be carried out by plasma dicing. The cutting lines CL are defined along the first direction x and the second direction y forming a grid. Each of the individual pieces separated in this step comprises a semiconductor device A10. Through the steps described above, the semiconductor device A10 is manufactured.

The following now describes advantages of the semiconductor device A10 and the method for manufacturing the same.

The semiconductor device A10 includes the electrically conductive shielding layer 12 and the electrically conductive frame 23 that stands on the shielding layer 12 in the direction in which the element front surface 311 of the semiconductor element 31 is facing along the thickness direction z. The frame 23 surrounds the semiconductor element 31 and the electroconductive pillars 22 in plan view. In addition, the frame 23 is configured to be electrically connectable to an external ground terminal. This configuration provides shielding to block electromagnetic radiation from external sources and the semiconductor element 31. In addition, when a potential difference between the interior and the exterior is caused across the shielding layer 12 and the frame 23 due to self-induction by electromagnetic radiation, the potential difference can be promptly reduced by electrically connecting the frame 23 to an external ground terminal.

In the semiconductor device A10, the shielding layer 12 is disposed below the semiconductor element 31 via the isolation layer 13 and the wiring layer 21. This configuration facilitates to reduce the dimension of the semiconductor device A10 in thickness direction z. In addition, the semiconductor device A10 has the frame 23 that stands in the thickness direction z, without expanding in the direction perpendicular to the thickness direction z. This configuration facilitates to reduce the dimension of the semiconductor device A10 in plan view. Thus, the overall size of the semiconductor device A10 can be reduced.

The semiconductor device A10 has the electroconductive pillars 22 standing in the same direction as the frame 23. Thus, although the semiconductor element 31 is enclosed within the frame 23, the electroconductive pillars 22 can provide conductive paths to the semiconductor element 31.

In the semiconductor device A10, the frame 23 is electrically connected to one of the electroconductive pillars 22, and the one electroconductive pillar 22 is connectable to an external ground terminal. Thus, the semiconductor device A10 is provided with a conductive path between the frame 23 and the external ground terminal.

The frame 23 stands in the thickness direction and has the inner surfaces 231 each of which faces the semiconductor element 31 and the outer surfaces 232 each of which faces in the opposite direction of the inner surface 231. The inner surfaces 231 and the outer surfaces 232 are all covered by the sealing resin 41. That is, the frame 23 is sandwiched by the sealing resin 41 in the direction perpendicular to the thickness direction z. In this way, the sealing resin 41 can protect the frame 23 and also prevent displacement of the frame 23 in the direction perpendicular to the thickness direction z.

In the semiconductor device A10, the outer edges of the shielding layer 12 and the frame 23 are located inside the sealing resin 41 in plan view. That is, the shielding layer 12 and the frame 23 are not exposed to the outside on the side surfaces of the semiconductor device A10. This configuration can increase the electrostatic discharge breakdown voltage of the semiconductor device A10.

The semiconductor device A10 includes the outer protective layer 42 that is electrically insulating. The outer protective layer 42 covers the mounting surface 411 of the sealing resin 41 and the top surface 233 of the frame 23. This configuration prevents that the frame 23 is accidentally connected to a wiring circuit board via an unintentional conduction path formed by solder used to mount the semiconductor device A10 to the wiring circuit board. In addition, the frame 23 is covered by the sealing resin 41 and the outer protective layer 42. This configuration can further increase the electrostatic discharge breakdown voltage of the semiconductor device A10.

The semiconductor device A10 includes the bonding layer 32 disposed between the wiring layer 21 and the electrodes 312A disposed on the element back surface 312. The bonding layer 32 provides electrical communication between the wiring layer 21 and the semiconductor element 31, allowing the semiconductor element 31 to be mounted on the wiring layer 21 by flip-chip bonding. That is, no wiring is required to electrically connect the semiconductor element 31 to the wiring layer 21 and thus the overall size of the semiconductor device A10 can be further reduced.

The semiconductor device A10 includes the inner protective layer 33, which is electrically insulating, surrounds the bonding layer 32 and covers at least a region of the wiring layer 21. At the time of reflowing for bonding semiconductor element 31 to the wiring layer 21, the inner protective layer 33 can prevent the bonding layer 32 in a molten state from flowing out.

With reference now to the method for manufacturing the semiconductor device A10, the frame 823 (corresponding to the frame 23) and the electroconductive pillars 822 (corresponding to the electroconductive pillars 22) are formed at the same time by electroplating. This ensures that the frame 23 is formed accurately and directly on the shielding layer 12, so that the mounting space for the frame 23 can be minimized in the semiconductor device A10.

The method for manufacturing the semiconductor device A10 includes, after the step of mounting semiconductor element 31, the step of forming the sealing resin 841 (corresponding to the sealing resin 41) to cover the electroconductive pillars 822 and the frame 823. In addition, in a subsequent step, the sealing resin 841 is removed in the thickness direction z to expose portions of the electroconductive pillars 822 and the frame 823 from the sealing resin 841. This step further reduces the dimension of the semiconductor device A10 in thickness direction z.

Figure 29:
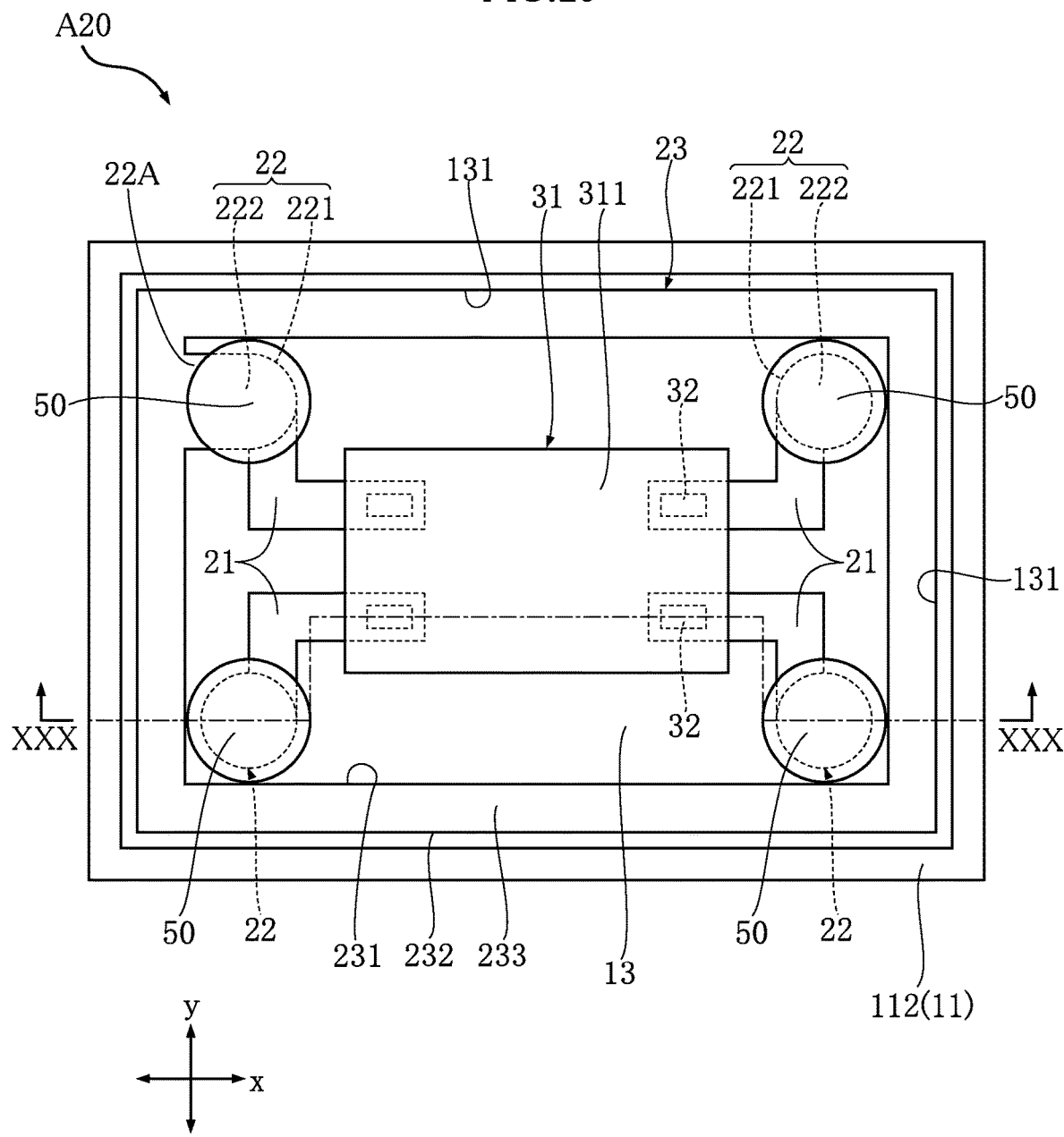
FIG. 29 is a plan view of a semiconductor device (with a sealing resin and an outer protective layer shown in phantom) according to a second embodiment of the present disclosure.
Figure 30:
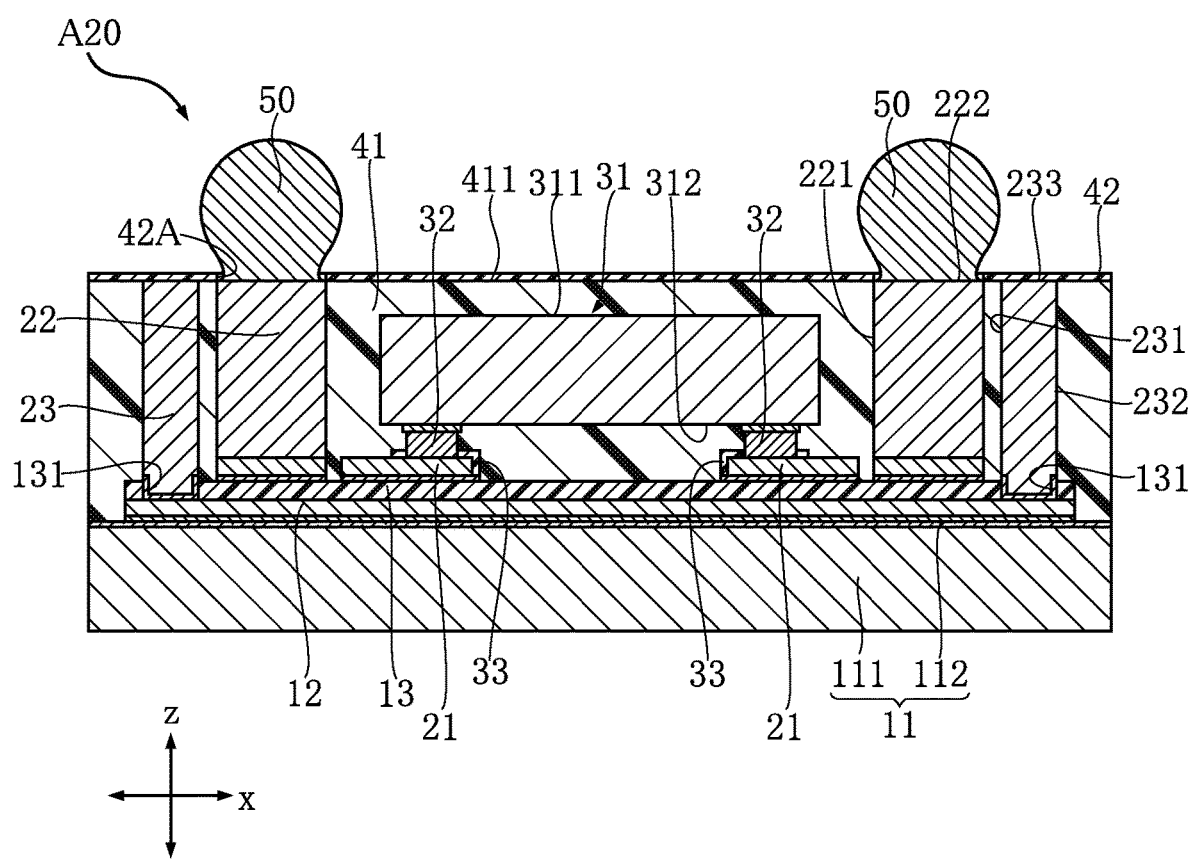
FIG. 30 is a sectional view taken along line XXX-XXX of FIG. 29.

With reference to FIGS. 29 and 30, a semiconductor device A20 according to a second embodiment of the present disclosure will be described. In the figures, the same reference signs are used to denote the same or similar components to those of the semiconductor device A10, and no redundant description will be given. FIG. 30 is a sectional view taken along long dashed dotted lines of FIG. 29.

The semiconductor device A20 differs from the semiconductor device A10 in the configuration of the electroconductive pillars 22 and the terminals 50. As shown in FIGS. 29 and 30, each terminal of the semiconductor device A20 is composed of a solder ball having a spherical shape. In conformity with the shape of the terminals 50, each electroconductive pillar 22 is a cylindrical pillar having a circular end surface 222. Consequently, the outer protective layer 42 of the semiconductor device A20 has openings 42A each of which is circular in plan view.

The following now describes advantages of the semiconductor device A20.

Similarly to the semiconductor device A10 described above, the semiconductor device A20 includes the electrically conductive shielding layer 12 and the electrically conductive frame 23 that stand on the shielding layer 12 in the direction in which the element front surface 311 of the semiconductor element 31 is facing in the thickness direction z. The frame surrounds the semiconductor element 31 and the electroconductive pillars 22 in plan view. In addition, the frame 23 is configured to be electrically connectable to an external ground terminal. That is, the semiconductor device A20 can block incoming and outgoing electromagnetic radiation to and from the semiconductor element 31, without obstructing miniaturization.

The semiconductor device A20 is provided with the terminals 50 composed of solder balls, which are commercially available. Thus, the terminals 50 can be formed more easily, as compared with the terminals 50 of the semiconductor device A10.

Figure 31:
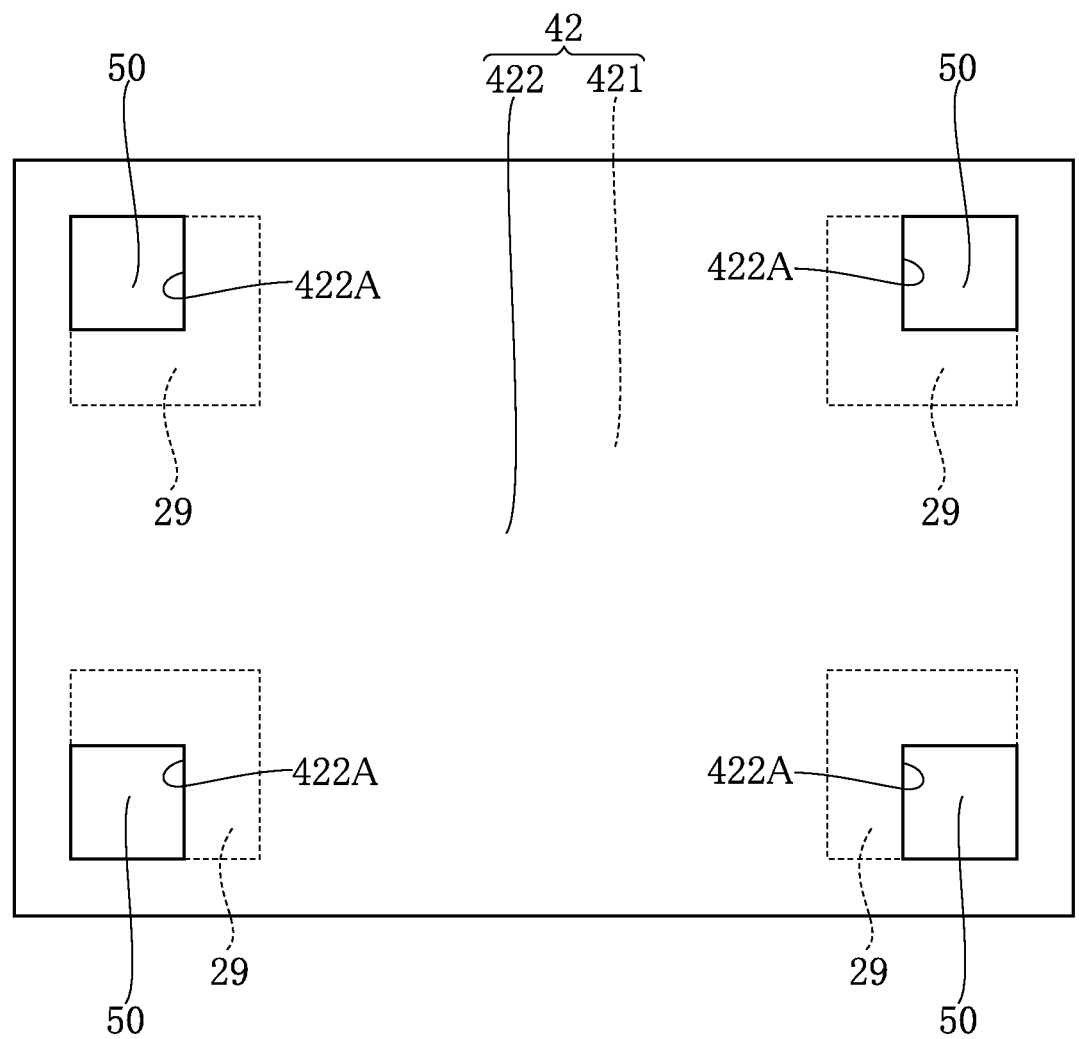
FIG. 31 is a plan view of a semiconductor device according to a third embodiment of the present disclosure.
Figure 32:
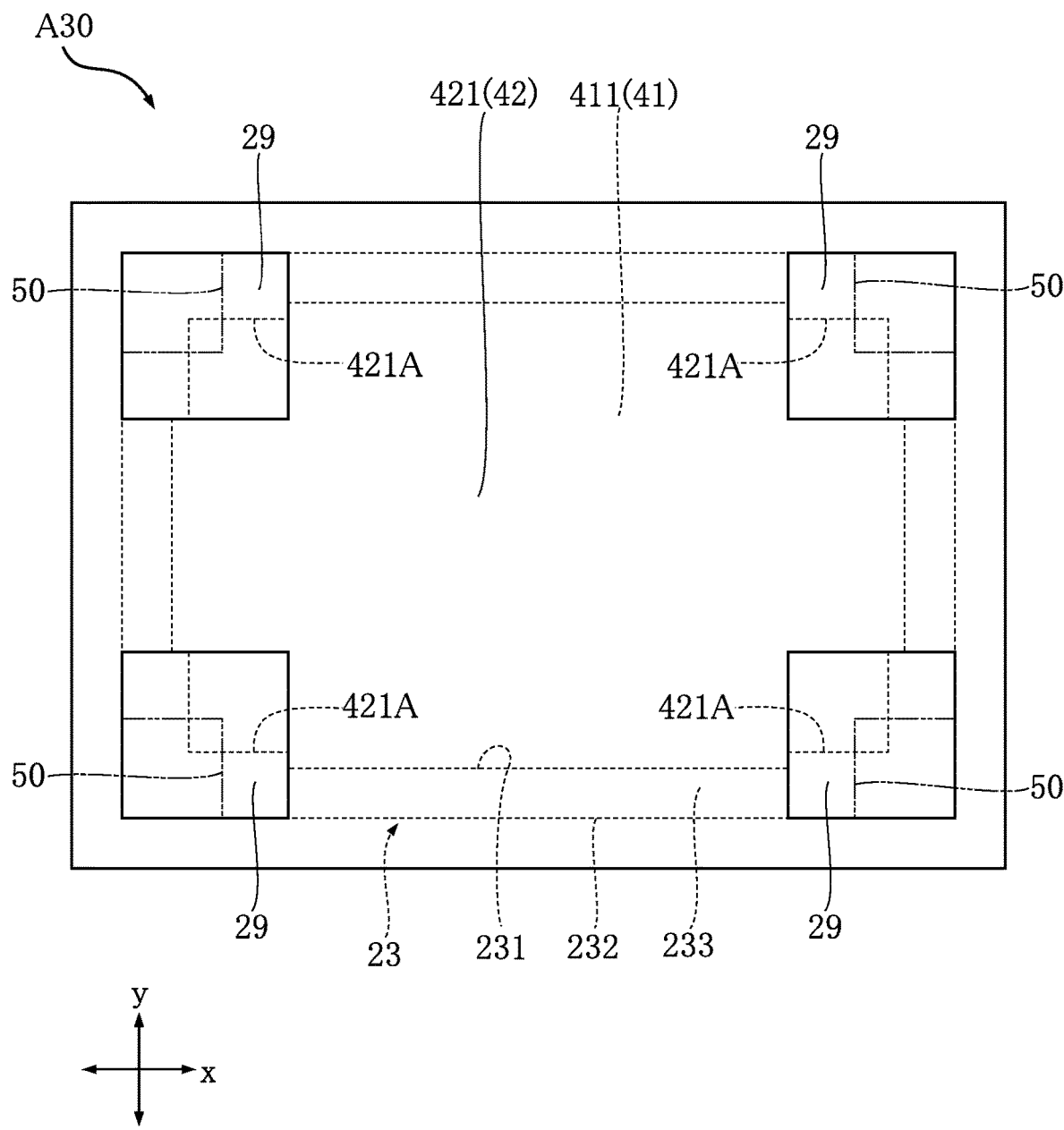
FIG. 32 is a plan view of FIG. 31, with a second protective layer and terminals shown in phantom.
Figure 33:
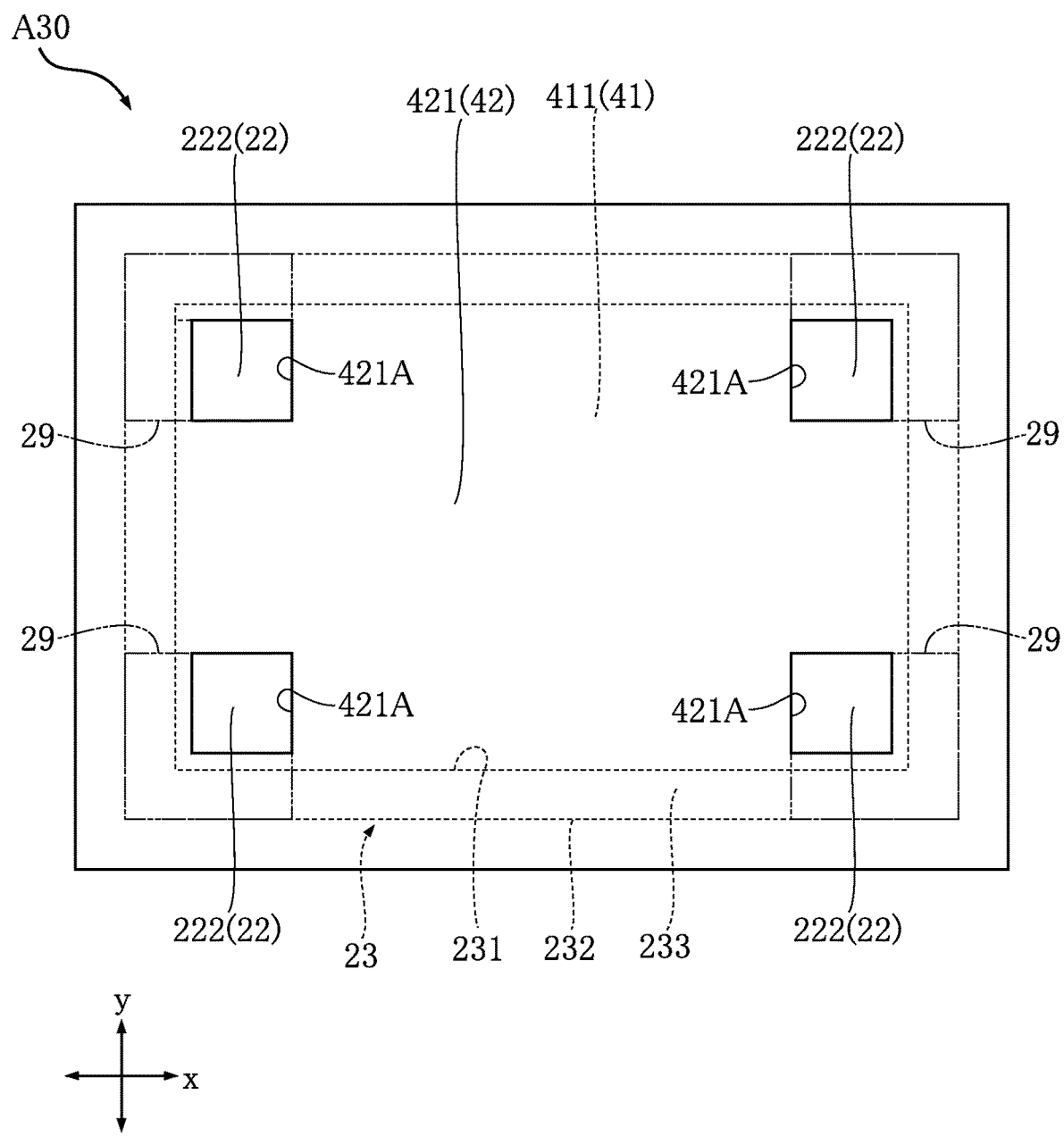
FIG. 33 is a plan view of FIG. 32, with a redistribution layer shown in phantom.
Figure 34:
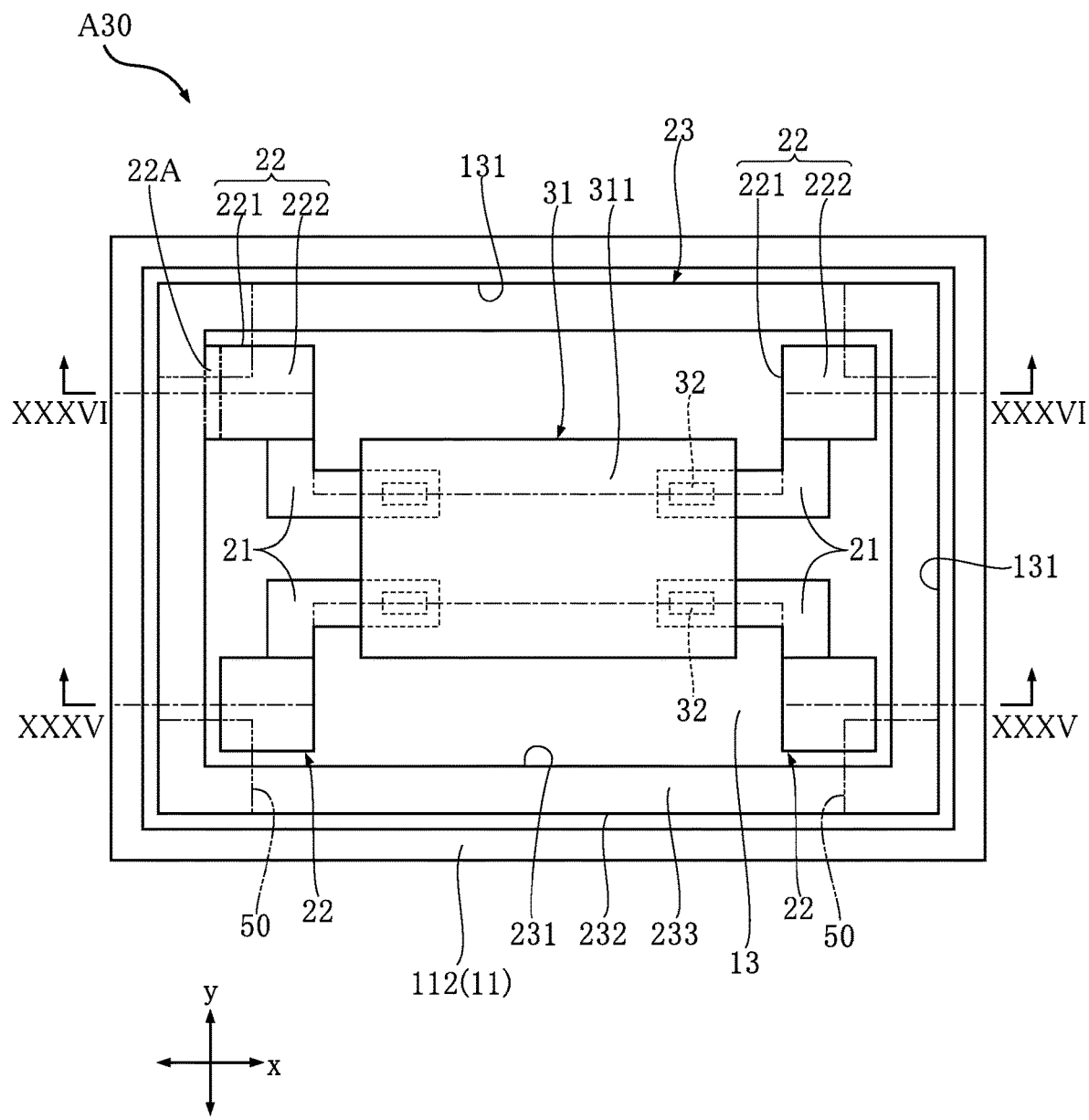
FIG. 34 is a plan view of FIG. 33, with a sealing resin and a first protective layer shown in phantom.
Figure 35:
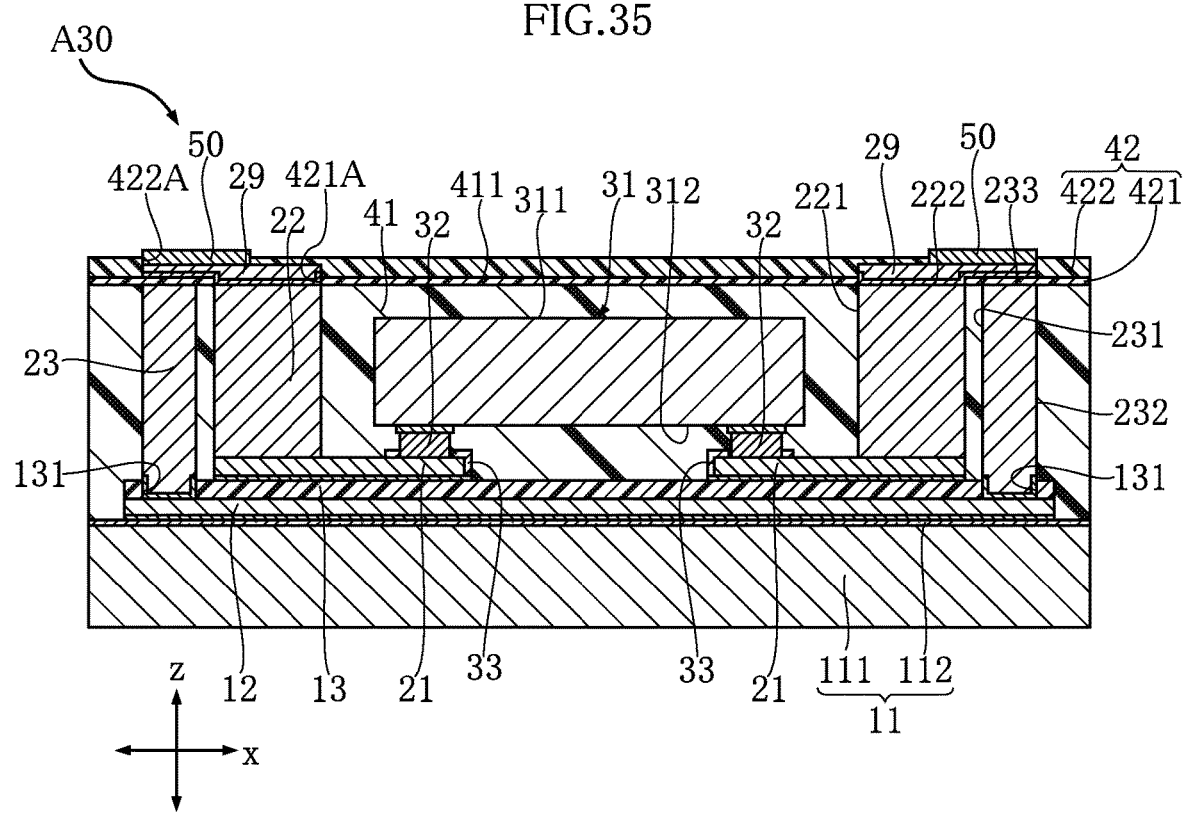
FIG. 35 is a sectional view taken along line XXXV-XXXV of FIG. 34.
Figure 36:
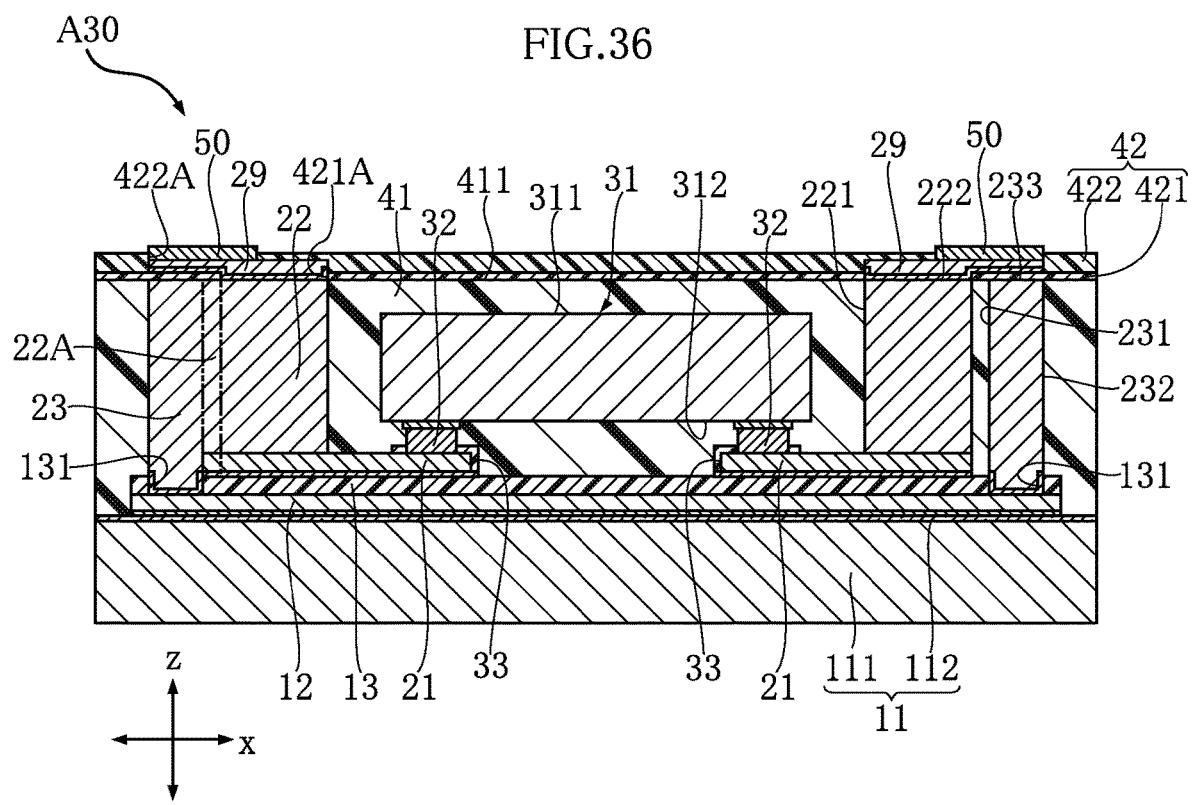
FIG. 36 is a sectional view taken along line XXXVI-XXXVI of FIG. 34.
Figure 37:
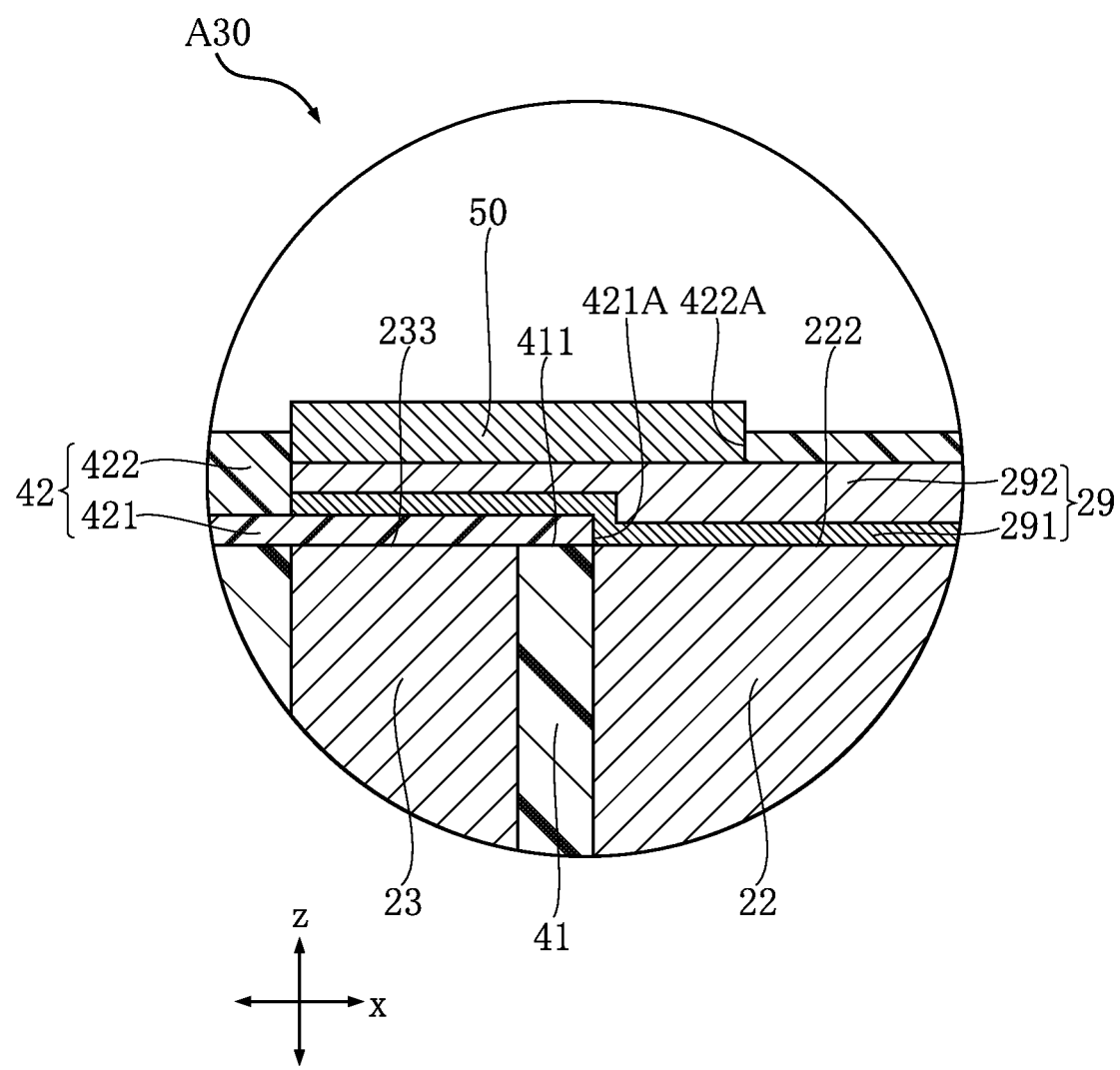
FIG. 37 is a partially enlarged view of FIG. 35.

With reference to FIGS. 31 and 37, a semiconductor device A30 according to a second embodiment of the present disclosure will be described. In the figures, the same reference signs are used to denote the same or similar components to those of the semiconductor device A10, and no redundant description will be given. FIGS. 32 and 34 shows the terminal 50 by phantom lines representing their outer edges. FIG. 33 shows a redistribution layer 29 by phantom lines representing its outer edges. FIGS. 35 and 36 are sectional views taken along long dashed dotted lines of FIG. 34. FIG. 37 is an enlarged view of a portion around one region of the redistribution layer 29 and one terminal 50 shown in FIG. 35.

The semiconductor device A30 differs from the semiconductor device A10 in the provision of the redistribution layer 29 and the configuration of the outer protective layer 42 and the terminals 50.

As shown in FIGS. 31 to 33, 35 and 36, the outer protective layer 42 is composed of a first protective layer 421 and a second protective layer 422. The first protective layer 421 and the second protective layer 422 are made of an electrically insulating material having the same composition. In the semiconductor device A30, the first protective layer 421 and the second protective layer 422 are made of the same photosensitive polyimide.

As shown in FIGS. 33, 35 and 36, the first protective layer 421 covers the mounting surface 411 of the sealing resin 41 and the top surface 233 of the frame 23. The first protective layer 421 has a plurality of first openings 421A each formed therethrough in the thickness direction z. The respective end surfaces 222 of the electroconductive pillars 22 are exposed through the first openings 421A.

As shown in FIGS. 31 to 33, 35 and 36, the redistribution layer 29 forms conductive paths between the electroconductive pillars 22 and the corresponding terminals 50. The redistribution layer 29 of the semiconductor device A30 is composed of an underlying layer 291 and a plating layer 292 laminated on the underlying layer 291. The underlying layer 291 is composed of a Ti layer and a Cu layer laminated on one another. The Ti layer is in contact with the end surfaces 222 of the electroconductive pillars 22 and also with the first protective layer 421. The underlying layer 291 covers the first openings 421A of the first protective layer 421. The plating layer 122 is made of Cu. The redistribution layer 29 is located between the first protective layer 421 and the second protective layer 422 in thickness direction z. The redistribution layer 29 is thus electrically insulated from the frame 23 by the first protective layer 421. The redistribution layer 29 is also electrically insulated from an external environment by the second protective layer 422.

As shown in FIGS. 31, 35 and 36, the second protective layer 422 partially covers the redistribution layer 29 and also covers the first protective layer 421. The second protective layer 422 has a plurality of first openings 422A formed therethrough in the thickness direction z. Regions of the redistribution layer 29 are exposed through the second openings 422A.

As shown in FIGS. 31, 32, 35 and 36, each terminal 50 is disposed in contact with a region of the redistribution layer 29 exposed through a second opening 422A. In the semiconductor device A30, each terminal 50 is formed by depositing a plating layer on the region of the redistribution layer 29 exposed through the second opening 422A. The plating layer is identical to the one for forming the terminal 50 of the semiconductor device A10. Alternatively, the terminals 50 may be composed of solder balls as in the semiconductor device A20.

The following now describes advantages of the semiconductor device A30.

Similarly to the semiconductor device A10 described above, the semiconductor device A30 includes the electrically conductive shielding layer 12 and the electrically conductive frame 23 that stand on the shielding layer 12 in the direction in which the element front surface 311 of the semiconductor element 31 is facing in the thickness direction z. The frame surrounds the semiconductor element 31 and the electroconductive pillars 22 in plan view. In addition, the frame 23 is configured to be electrically connectable to an external ground terminal. That is, the semiconductor device A30 can block incoming and outgoing electromagnetic radiation to and from the semiconductor element 31, without obstructing miniaturization.

The semiconductor device A30 is provided with the redistribution layer 29 that forms conductive paths between the electroconductive pillars 22 and the terminals 50. In addition, the outer protective layer 42 is composed of the first protective layer 421 and the second protective layer 422 each of which is electrically insulating. The redistribution layer 29 is located between the first protective layer 421 and the second protective layer 422 in thickness direction z. This configuration provides design flexibility, allowing the terminals 50 to be located anywhere in plan view. For example, the terminals 50 may be located to partially overlap with the frame 23 in plan view.

The present disclosure is not limited to the specific embodiments described above, and various changes may be made to the specific configurator of each component.

The invention claimed is:

1. A semiconductor device comprising:
an electroconductive shielding layer;
an isolation layer formed on the shielding layer and comprising a frame-shaped opening as viewed in a thickness direction;
a wiring layer disposed on the isolation layer so as to be surrounded by the opening;
a semiconductor element having an element front surface and an element back surface that are opposite to each other in the thickness direction, the semiconductor element being disposed on the wiring layer with the element back surface facing the wiring layer;
electroconductive pillars spaced apart from the semiconductor element and standing on the wiring layer in the thickness direction;
an electroconductive frame standing on a region of the shielding layer exposed through the opening in the thickness direction, the frame surrounding the semiconductor element and the electroconductive pillars as viewed in the thickness direction; and
an electrically insulating sealing resin covering the wiring layer and the semiconductor element,
wherein the frame is configured to be electrically connected to an external ground terminal.

2. The semiconductor device according to claim 1, wherein the frame is electrically connected to one of the electroconductive pillars, and wherein the one of the electroconductive pillars is electrically connected to the external ground terminal.

3. The semiconductor device according to claim 1, wherein the electroconductive pillars and the frame contain a same metal.

4. The semiconductor device according to claim 3, wherein the electroconductive pillars and the frame contain Cu.

5. The semiconductor device according to claim 1, wherein the sealing resin has a mounting surface, and each of the electroconductive pillars has a side surface standing in the thickness direction and an end surface intersecting the side surface, the side surface being covered by the sealing resin, the end surface being flush with the mounting surface of the sealing resin.

6. The semiconductor device according to claim 1, wherein the frame comprises an inner surface standing in the thickness direction and facing the semiconductor element and an outer surface opposite to the inner surface, and the sealing resin covers the inner surface and the outer surface.

7. The semiconductor device according to claim 6, wherein the frame comprises a top surface intersecting the inner surface and the outer surface, and the top surface is flush with the mounting surface of the sealing resin.

8. The semiconductor device according to claim 1, wherein the sealing resin covers an outer edge of shielding layer and an outer edge of the frame as viewed in the thickness direction.

9. The semiconductor device according to claim 1, further comprising an insulating outer protective layer that covers the mounting surface and the top surface.

10. The semiconductor device according to claim 9, wherein the end surface of each of the electroconductive pillars is formed with a terminal exposed to outside of the semiconductor device.

11. The semiconductor device according to claim 10, wherein the terminal comprises plating layers.

12. The semiconductor device according to claim 10, wherein the terminal comprises a solder ball.

13. The semiconductor device according to claim 1, further comprising a bonding layer for electrically connecting the wiring layer and the semiconductor element, wherein the semiconductor element comprises an electrode provided on the element back surface, and the bonding layer is disposed between the wiring layer and the electrode of the semiconductor element.

14. The semiconductor device according to claim 13, further comprising an insulating inner protective layer, wherein the inner protective layer surrounds the bonding layer as viewed in the thickness direction and covers at least a region of the wiring layer.

15. The semiconductor device according to claim 1, further comprising a substrate in contact with the shielding layer in the thickness direction, wherein the substrate comprises abase member made of an intrinsic semiconductor material and an insulating film disposed between the base member and the shielding layer.

16. The semiconductor device according to claim 15, wherein the base member is made of Si.

* * * * *